(12) United States Patent
Garudadri et al.

(10) Patent No.: US 9,075,446 B2
(45) Date of Patent: Jul. 7, 2015

(54) METHOD AND APPARATUS FOR PROCESSING AND RECONSTRUCTING DATA

(75) Inventors: Harinath Garudadri, San Diego, CA (US); Pawan K. Baheti, San Diego, CA (US); Somdeb Majumdar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 939 days.

(21) Appl. No.: 12/972,005

(22) Filed: Dec. 17, 2010

(65) Prior Publication Data

US 2012/0005248 A1 Jan. 5, 2012

Related U.S. Application Data

(60) Provisional application No. 61/313,949, filed on Mar. 15, 2010.

(51) Int. Cl.
*H03M 7/30* (2006.01)
*G06F 7/02* (2006.01)

(52) U.S. Cl.
CPC ............... *G06F 7/02* (2013.01); *H03M 7/3059* (2013.01); *H03M 7/30* (2013.01); *G06F 2207/02* (2013.01)

(58) Field of Classification Search
CPC ............ H03M 7/3059; H03M 7/3062; H03M 7/3064; H03M 7/30
USPC ......................................................... 708/203
See application file for complete search history.

(56) References Cited

U.S. PATENT DOCUMENTS

| 5,092,341 | A | 3/1992 | Kelen |
| 5,355,430 | A * | 10/1994 | Huff ............................. 704/223 |
| 5,774,844 | A | 6/1998 | Akagiri |
| 5,886,276 | A | 3/1999 | Levine et al. |
| 6,098,039 | A | 8/2000 | Nishida |
| 6,449,596 | B1 | 9/2002 | Ejima |
| 6,658,382 | B1 | 12/2003 | Iwakami et al. |
| 7,020,615 | B2 | 3/2006 | Vafin et al. |
| 7,272,556 | B1 | 9/2007 | Aguilar et al. |
| 2009/0106030 | A1 | 4/2009 | Den Brinker et al. |
| 2010/0246651 | A1 | 9/2010 | Baheti et al. |

(Continued)

FOREIGN PATENT DOCUMENTS

| CN | 1071769 A | 5/1993 |
| JP | S58223927 A | 12/1983 |

(Continued)

OTHER PUBLICATIONS

Kulkarni, "Sampling and Quantization", pp. 1-16, 2002.*

(Continued)

*Primary Examiner* — Chuong D Ngo
(74) *Attorney, Agent, or Firm* — Joseph S. Hanasz

(57) ABSTRACT

Certain aspects of the present disclosure relate to a method for quantizing signals and reconstructing signals, and/or encoding or decoding data for storage or transmission. Points of a signal may be determined as local extrema or points where an absolute rise of the signal is greater than a threshold. The tread and value of the points may be quantized, and certain of the quantizations may be discarded before the quantizations are transmitted. After being received, the signal may be reconstructed from the quantizations using an iterative process.

77 Claims, 32 Drawing Sheets

(56) References Cited

U.S. PATENT DOCUMENTS

| | | |
|---|---|---|
| 2010/0262420 A1 | 10/2010 | Herre et al. |
| 2011/0066381 A1 | 3/2011 | Garudadri et al. |
| 2012/0224611 A1 | 9/2012 | Baheti et al. |
| 2015/0006598 A1 | 1/2015 | Garudadri et al. |

FOREIGN PATENT DOCUMENTS

| | | |
|---|---|---|
| JP | S59216282 A | 12/1984 |
| JP | H06209909 A | 8/1994 |
| JP | H06339470 A | 12/1994 |
| JP | H10161633 A | 6/1998 |
| JP | H11145846 A | 5/1999 |
| JP | 2000106529 A | 4/2000 |
| JP | 2001136073 A | 5/2001 |
| JP | 2002010987 A | 1/2002 |
| JP | 2007318287 A | 12/2007 |
| JP | 4196775 B2 | 12/2008 |
| WO | WO0019414 A1 | 4/2000 |

OTHER PUBLICATIONS

Benzid, et al., "Fixed Percentage of Wavelet Coefficients to Be Zeroed for ECG Compression," in Electron. Lett., vol. 39, No. 11 (2003), pp. 830-831.

Candes E, "Compressive Sampling: Sense-less but Smart", Thesis Feb. 1, 2007, pp. 1-35, XP007905383, the whole document.

Divya Venkatraman, et al.,"A compressive sensing approach to object-based surveillance video coding", Acoustics, Speech and Signal Processing, 2009. ICASSP 2009. IEEE International Conference on, IEEE, Piscataway, NJ, USA, Apr. 19, 2009, pp. 3513-3516, XP031460029, ISBN: 978-1-4244-2353-8.

Gemmeke J. F., et al., "Compressive Sensing for Missing Data Imputation in Noise Robust Speech Recognition", IEEE Journal of Selected Topics in Signal Processing, IEEE, US, vol. 4, No. 2, Apr. 1, 2010, pp. 272-287, XP011327594, ISSN: 1932-4553, DOI: 10.1109/JSTSP.2009.2039171.

Gleichman, et al., "Blind Compress Sensing," arXiv:1002.2586v2 [cs.IT], Apr. 28, 2010, pp. 1-17.

International Search Report and Written Opinion—PCT/US2011/028556, International Search Authority—European Patent Office—Aug. 4, 2011.

Mohammadpour, et al., "ECG Compression with Thresholding of 2-D Wavelet Transform Coefficients and Run Length Coding," in European Journal of Scientific Research, vol. 27 No. 2 (2009), pp. 248-257.

Ruizhen Zhao, et al., "Signal pre-processing method suitable for compressive sensing based on frequency modulation", Signal Processing (ICSP), 2010 IEEE 10th International Conference on, IEEE, Piscataway, NJ, USA, Oct. 24, 2010, pp. 62-65, XP031817362, ISBN: 978-1-4244-5897-4.

The Sampling Theorem,Signal Reconstruction, Jul. 2002, XP002649306, Retrieved from the Internet: URL:http://www.st-andrews.ac.uk/www_pa/Scots_Guide/iandm/part7/page3.html.

Hao et al., "Compression of ECG as a Signal with Finite Rate of Innovation", Proceedings of the 2005 IEEE Engineering in Medicine and Biology 27th Annual Conference, Shanghai, China, Sep. 1-4, 2005.

Poh et al., "Compressive Sampling of EEG Signals with Finite Rate of Innovation", Hindawi Publishing Corp., EIRASIP Journal on Advances in Signal Processing, vol. 2010, Article ID 183105, 12 pages, 2010.

\* cited by examiner

Raw ECG data and compressed sub-Nyquist measurements

Example ECG segment (both raw and decoded using sub-Nyquist measurements)

Example ECG segment (both raw and decoded using sub-Nyquist measurements)

Simulation study to analyze the variances of the PCA coefficients obtained from raw and decoded ECG segments.

Example 3D-accelerometer data for x, y and z axes (both raw and decoded using sub-Nyquist measurements); the data captured here represents activity = turn upside down Example 3D-accelerometer data for x, y and z axes (both raw and decoded using sub-Nyquist measurements); the data captured here represents activity = sit-stand-sit Example 3D-accelerometer data for x, y and z axes (both raw and decoded using sub-Nyquist measurements); the data captured here represents activity – multiple states in sequence Example 3D-accelerometer data for x axis (both raw and decoded using sub-Nyquist measurements): each EMD component was subjected to inflexion point compression and all the decoded EMD components were added to provide this simulation; the data captured here represents activity = turn upside down

METHOD AND APPARATUS FOR PROCESSING AND RECONSTRUCTING DATA

CROSS-REFERENCE TO RELATED APPLICATION

This application claims priority under 35 U.S.C. §119(e) to U.S. Provisional Application No. 61/313,949, filed on Mar. 15, 2010, which is hereby incorporated by reference in its entirety.

BACKGROUND

1. Field

Certain aspects of the present disclosure generally relate to signal processing and, more particularly, to methods of encoding and decoding signals for transmission or storage.

2. Description of Related Technology

Networks such as body area networks (BANs) make use of wireless sensors such as pulse oximeters, electrocardiogram (ECG) sensors, and 3D-accelerometers to monitor vital signs of individuals. In order to improve the performance of such BANs, it is desirable to reduce the power consumption and/or complexity of wireless sensor devices in the BANs. Thus there is a need for low power devices which can accurately detect and/or communicate vital signs of individuals.

SUMMARY

Certain aspects provide a method of processing data. The method generally includes determining a plurality of points in a signal and determining at least one measurement comprising a quantized signal value at one of the plurality of points and a quantized tread at the one point. At least one of the plurality of points comprises a local maximum or a local minimum of the signal or a point having a value of the signal that when comparing to a value of another point of the signal yields a difference being greater than a first threshold. The separation between adjacent samples may be referred to as a tread or a tread value. Tread may be computed as the difference between the location of a point and the location of an adjacent point. The unit of tread may be time and may be represented, for example, in microseconds, milliseconds, number of samples, number of clock cycles, or by another such unit of time.

Certain aspects provide an apparatus for processing data. The apparatus generally includes a processing system configured to determine a plurality of points in a signal, and at least one measurement comprising a quantized signal value at one of the plurality of points and a quantized tread at the one point. At least one of the plurality of points comprises a local maximum or a local minimum of the signal or a point having a value of the signal that when comparing to a value of another point of the signal yields a difference being greater than a first threshold.

Certain aspects provide an apparatus for processing data. The apparatus generally includes means for determining a plurality of points in a signal and means for determining at least one measurement comprising a quantized signal value at one of the plurality of points and a quantized tread at the one point. At least one of the plurality of points comprises a local maximum or a local minimum of the signal or a point having a value of the signal that when comparing to a value of another point of the signal yields a difference being greater than a first threshold.

Certain aspects provide a computer program product. The computer program generally includes a computer readable medium comprising instructions that when executed cause an apparatus to determine a plurality of points in a signal and determine at least one measurement comprising a quantized signal value at one of the plurality of points and a quantized tread at the one point. At least one of the plurality of points comprises a local maximum or a local minimum of the signal or a point having a value of the signal that when comparing to a value of another point of the signal yields a difference being greater than a first threshold.

Certain aspects provide a sensing device. The sensing device generally includes a processing system configured to determine a plurality of points in a signal. At least one of the plurality of points comprises a local maximum or a local minimum of the signal or a point having a value of the signal that when comparing to a value of another point of the signal yields a difference being greater than a first threshold. The processing system is further configured to determine at least one measurement comprising a quantized signal value at one of the plurality of points and a quantized tread at the one point. The device further includes a transmitter configured to transmit the quantized tread and the quantized signal value of at least one of the plurality of points.

Certain aspects provide a headset. The headset generally includes a transducer configured to provide a signal and a processing system configured to determine a plurality of points in the signal. At least one of the plurality of points comprises a local maximum or a local minimum of the signal or a point having a value of the signal that when comparing to a value of another point of the signal yields a difference being greater than a first threshold. The processing system is further configured to determine at least one measurement comprising a quantized signal value at one of the plurality of points and a quantized tread at the one point.

Certain aspects provide a method of processing data. The method generally includes receiving a plurality of measurements indicative of a signal, reconstructing the signal based at least in part on the plurality of measurements, and modifying the value of at least one sample of the reconstructed signal based on the measurements. The plurality of measurements comprise at least a tread and a value at points of the signal.

Certain aspects provide an apparatus for processing data. The apparatus generally includes a receiver configured to receive a plurality of measurements indicative of a signal, and a processing system configured to reconstruct the signal based at least in part on the plurality of measurements. The processing system is further configured to modify the value of at least one sample of the reconstructed signal based on the measurements. The plurality of measurements comprise at least a tread and a value at points of the signal.

Certain aspects provide an apparatus for processing data. The apparatus generally includes means for receiving a plurality of measurements indicative of a signal, means for reconstructing the signal based at least in part on the plurality of measurements, and means for modifying the value of at least one sample of the reconstructed signal based on the measurements. The plurality of measurements comprise at least a tread and a value at points of the signal.

Certain aspects provide a computer program product. The computer program generally includes a computer readable medium comprising instructions that when executed cause an apparatus to receive a plurality of measurements indicative of a signal, reconstruct the signal based at least in part on the plurality of measurements, and modify the value of at least one sample of the reconstructed signal based on the measurements. The plurality of measurements comprise at least a tread and a value at points of the signal.

Certain aspects provide a monitoring device. The monitoring device generally includes an antenna, and a receiver configured to receive, via the antenna, a plurality of measurements indicative of a plurality of signals. The plurality of measurements comprise at least a tread and a value at points of the plurality of signals. The device further includes a processing system configured to reconstruct at least one of the plurality of signals based at least in part on the plurality of measurements, and further configured to modify the value of at least one sample of the reconstructed signal based on the measurements.

BRIEF DESCRIPTION OF THE DRAWINGS

So that the manner in which the above-recited features of the present disclosure can be understood in detail, a more particular description, briefly summarized above, may be discussed with reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
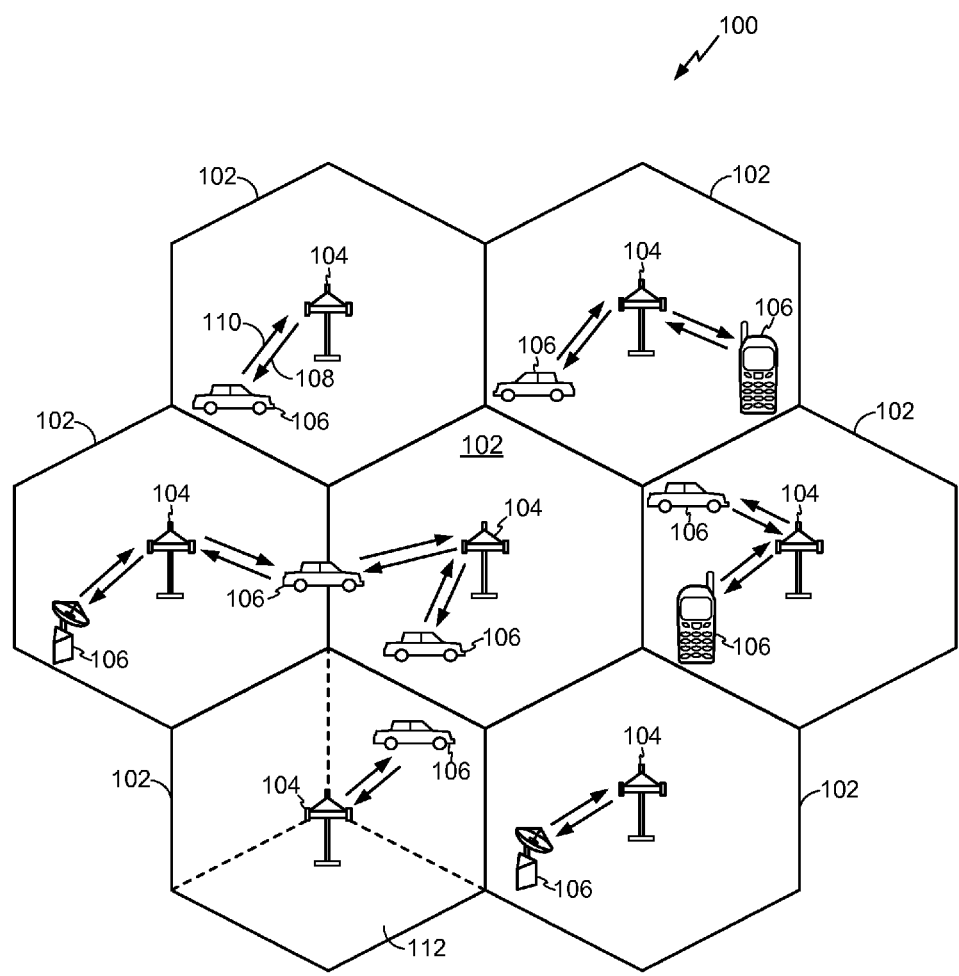
FIG. 1 illustrates an example wireless communication system.

Various aspects of the novel systems, apparatuses, and methods are described more fully hereinafter with reference to the accompanying drawings. The teachings disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The teachings herein may be incorporated into (e.g., implemented within or performed by) a variety of wired or wireless apparatuses (e.g., nodes). In some aspects, a node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as an access terminal, a subscriber station, a subscriber unit, a mobile station, a remote station, a remote terminal, a user terminal, a user agent, a user device, user equipment, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless or wired medium. In some aspects the node is a wireless node. Such wireless node may provide, for example, connectivity for or to a network (e.g., a wide area network such as the Internet or a cellular network) via a wired or wireless communication link.

FIG. 1 illustrates an example of a wireless communication system 100 in which aspects of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, headsets, wireless modems, laptop computers, personal computers, etc.

A variety of processes and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system. Alternatively, signals may be sent and received between the base stations 104 and the user terminals 106 in accordance with CDMA techniques. If this is the case, the wireless communication system 100 may be referred to as a CDMA system.

A communication link that facilitates transmission from a base station 104 to a user terminal 106 may be referred to as a downlink (DL) 108, and a communication link that facilitates transmission from a user terminal 106 to a base station 104 may be referred to as an uplink (UL) 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
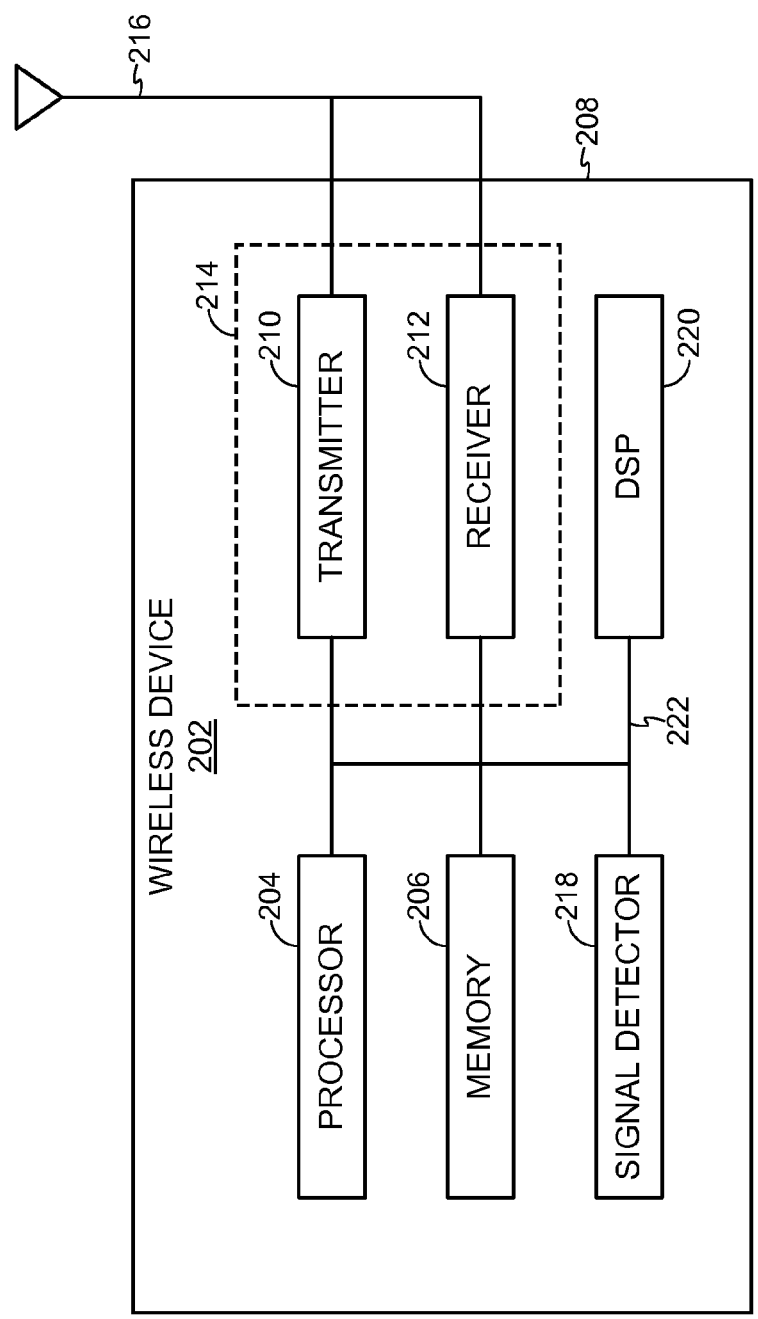
FIG. 2 is a block diagram illustrating various components that may be utilized in a wireless device.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

An Example Body Area Network

Figure 3:
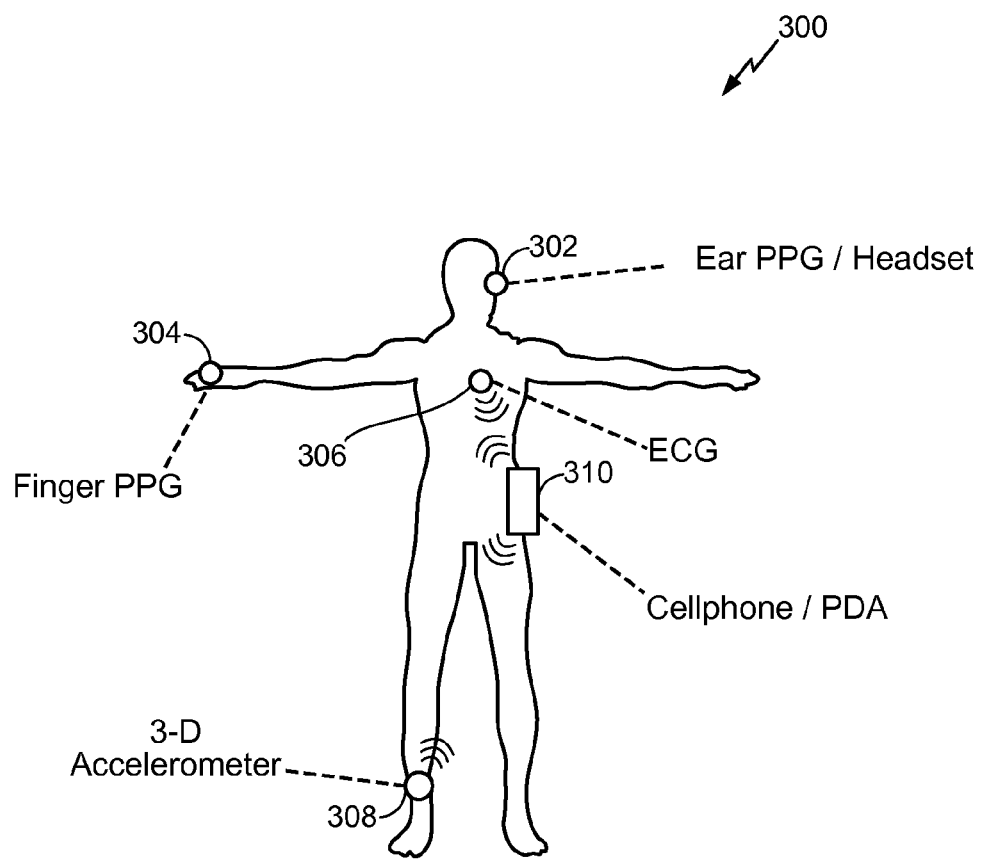
FIG. 3 illustrates an example of a body area network (BAN).

FIG. 3 illustrates an example of a body area network (BAN) 300. Body area networks represent a promising concept for healthcare applications such as continuous monitoring of vital signs for diagnostic purposes, effects of medicines on chronic ailments, etc.

The BAN may consist of several wireless sensors. Each wireless sensor may comprise at least one acquisition circuit that senses one or more vital signs and communicates them to an aggregator (e.g., an access terminal) such as a mobile handset, a wireless watch, or a Personal Data Assistant (PDA). The aggregator is sometimes referred to as the gateway. Sensors 302, 304, 306, and 308 that acquire various biomedical signals and transmit them over a wireless channel to an aggregator 310 may have the same or similar functionality as access points 104.

The aggregator 310 illustrated in FIG. 3 may receive and process various biomedical signals transmitted over a wireless channel from sensors 302-308. The aggregator 310 may be a mobile handset or a PDA, and may have the same or similar functionality as a mobile device 106 from FIG. 1 and/or a wireless device 202 from FIG. 2.

It may be desirable for sensors used in the BAN to be non-intrusive and long lasting. Photoplethysmograph (PPG) and Electro Cardiogram (ECG) signals and/or activity may be sensed or monitored for a large percentage of chronic ailments in a large segment of human population. There are significant opportunities for wireless technologies in the BAN and mobile devices with wireless area network (WAN) connectivity to improve diagnosis and care of such ailments.

Figure 4:
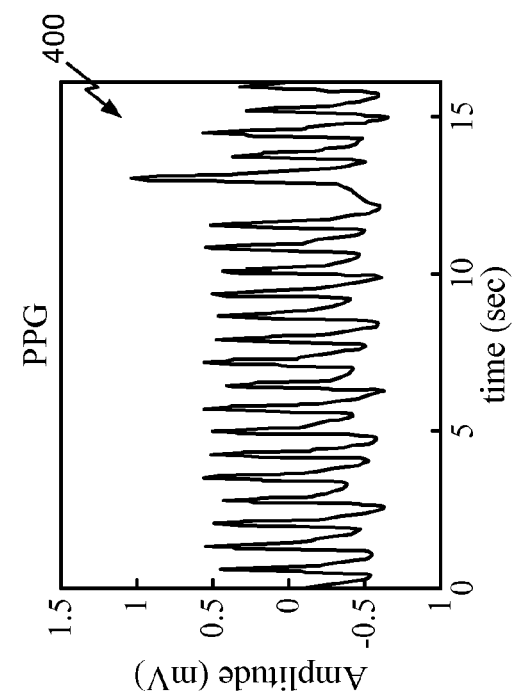
FIG. 4 illustrates an example of a time-domain photoplethysmograph (PPG) signal.

Pulse oximeter sensors can generate the PPG waveform which may enable continuous monitoring of blood oxygenation (also called $S_pO_2$), a crucial indicator of pulmonary system including lungs and respiration. Blood carries oxygen, nutrients and chemicals to the body cells in order to ensure their survival and proper functioning, and to remove cellular wastes. $S_pO_2$ is extensively used in clinical settings for diagnosis, surgery, long term monitoring, etc. FIG. 4 illustrates an example of a time-domain PPG signal 400.

Figure 5:
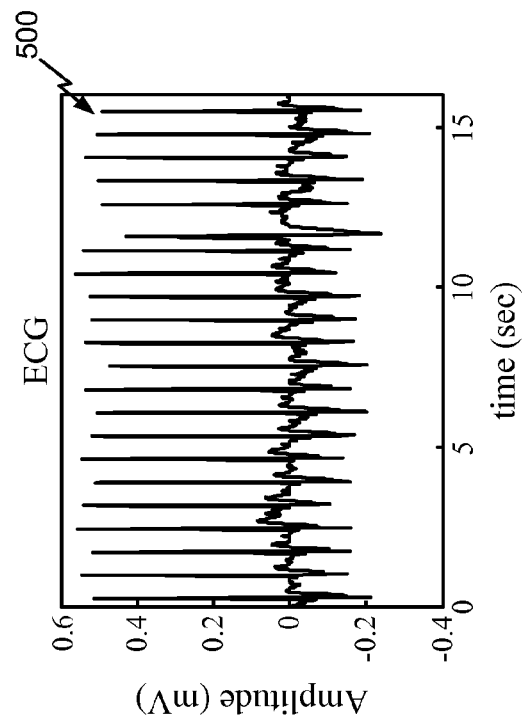
FIG. 5 illustrates an example of a time-domain electrocardiogram (ECG) signal.

The ECG is another important vital sign for assessing the cardiovascular system. The heart is one of the most hard working body parts, pumping about six liters of blood per minute through the body in humans. Electrical signals generated during each cardiac cycle form the ECG signal and can be captured by Ag/AgCl electrode sensors. The ECG may be routinely used in clinical settings for diagnosing heart related problems and continuous monitoring of the ECG may enable early diagnosis of many chronic conditions. FIG. 5 illustrates an example of a time-domain ECG signal 500. Blood pressure (BP) is another vital sign with enormous clinical value. Systolic blood pressure (SBP) and diastolic blood pressure (DBP) may be estimated using the ECG and the PPG signals.

In certain aspects, one or more of the sensors 302-308 and/or the aggregator 310 described herein make use of compressed sensing (CS). In CS, signals acquired at the sensors 302-308, for example the PPG signal illustrated in FIG. 4 or the ECG signal illustrated in FIG. 5, may be compressed during or after acquisition for more efficient transmission and/or storage. Further, signals encoded using a CS approach described herein may be decoded at the aggregator 310. In some aspects, significantly fewer sensor samples than that suggested by the Shannon/Nyquist sampling theorem can be used to recover signals with arbitrarily fine resolution.

For example, consider a short term segment of a band-limited signal x(t) of duration T and bandwidth B. Let x(n), 1≤n≤N, represent a discrete version of x(t), $$x(n) = x(t)|_{t=nT_s} \quad (1)$$

such that $T_s \le 1/2B$.

From the Nyquist sampling theorem, it can be recognized that x(t) can be reconstructed if there are at least N=T*2B samples, uniformly spaced between 0 and T at every $T_s=1/2B$ seconds. Then $F_s=2B$ is the Nyquist sampling frequency. The fact that x(t) can be reconstructed from N samples stems from the equivalence of continuous and discrete Fourier spectra X(f) and X(ω) in the range {−B,B}. If x(n) is quantized with q bits per sample, the Nyquist rate is $q*F_s$ and provides 6q dB dynamic range in the discrete domain. In the Fourier space, x can be represented as $$X = Wx \quad (2)$$

where W is an orthonormal basis set consisting of exponentials and can be written as a N×N matrix $$[W]_{m,n} = \frac{1}{\sqrt{N}} e^{[-i(2\pi/N)mn]}.$$

In CS, the signal samples r(n), 1≤k≤K can be mathematically represented as $$r = Hx \quad (3)$$

where H is a K×N matrix. For the Nyquist case, H=IN, an identity matrix of size N.

In some aspects, x(t) has a lot of redundancy in the time domain, such that there are only M components with magnitude greater than $\epsilon$ in X of Eq. 2, where $\epsilon \ll \max(X)$, and M≪N. In this case, W may be referred to as the sparse basis. In a CS paradigm as described herein, if one is able to construct a sensing matrix H of dimension K×N that is statistically incoherent with the sparse basis W, then only K samples from Eq. 3 are adequate to estimate x with a high probability of some small reconstruction error, provided K≥M log N/M. The elements of H may be generated using some random process to meet the constraint of statistical incoherence with the known basis W. One approach to signal reconstruction from (r, H, W) is an iterative process called the gradient-projection based sparse reconstruction (GPSR), given as $$\hat{y} \equiv \min_y \left[ \|HW^{-1}y - r\|^2 + \tau \sum_{i=1}^{N} |[f]_i[y]_i| \right] \quad (4)$$

and $$\hat{x} = W^{-1}\hat{y}. \quad (5)$$

In the optimization process of Eq. 4, the first term enforces sample fidelity and the second term enforces signal sparsity. The quantity τ is a non-negative parameter providing relative weight of $L_2$-norm and $L_1$-norm in the cost function. The terms $[f]_i$ and $[y]_i$ denote the $i^{th}$ element of vectors f and y, respectively. The term f was introduced to incorporate a priori sparsity information in the $L_1$-norm during reconstruction. In some aspects, f is estimated offline. In one aspect, W can be considered as Gabor functions, consisting of various cosine waves with time support limited by Gaussian window functions at different scales, such that the (i, j) entry of W is given by $$[W]_{m,n} = \cos\left(\frac{2\pi mn}{2N}\right) \times \exp\left(-\frac{m^2(n-N/2)^2}{wN^2}\right) \quad (6)$$

where m,n=0 . . . N−1. The term w is associated with the width of the Gaussian kernel. Each row of the matrix W can be normalized such that its $L_2$-norm is equal to 1.

Thus, CS as described herein may involve identifying a sparse basis W, designing an appropriate sensing kernel H in Eq. 3 that is incoherent with W, and a reconstruction recipe such as Eq. 4 that also incorporates a priori information. Eq. 5 can then be used to estimate the signal with K samples instead of N samples. An under sampling ratio (USR) can then be defined as N/K.

The reconstruction process may be an iterative approach, such that $\hat{x}$ may be defined as in Eqs. 4 and 5, where the optimization cost function $f$ (r, H, W) can be comprised of several additive terms enforcing various constraints (for example, in a weighted manner similar to a Lagrange formulation). The various individual components for function $f$ may include:

i. $L_2$ norm on the sample error=$\|r-H\hat{x}\|_{L_2}$.
ii. $L_p$ norm on the sparse transformation $\hat{y}=\|W\hat{x}\|_{L_p}$, where p≤1.
iii. $L_2$ norm on the smoothness error=$\|g(r)-\hat{x}\|_{L_2}$, where g(r) is the interpolated version using the samples r, and the interpolation g can be cubic spline based, chirp based, etc.

In certain aspects, devices described herein and/or devices implementing methods described herein may process data, resulting in reduced power consumption as compared to previously known devices. For example, one or more of the methods and/or devices described herein may be utilized to implement CS as described above to reduce a power at an encoding device. In addition, devices described herein may have a lower complexity than previously known devices. Reducing complexity in this way may reduce costs of manufacture, battery usage, and/or memory usage, and may increase efficiency and speed. In some aspects, data is sampled at a rate below the Nyquist sampling rate and compression of the data may be achieved without significant loss. For example, the PPG signal of FIG. 4 or the ECG signal of FIG. 5 may be sampled and/or compressed, and may thereafter be packetized, stored, and/or transmitted. Certain aspects may shift computational complexity from an encoder with stringent power requirements to a decoder with flexible power budget, for example in order to increase working life of sensors employed in the BAN.

In certain aspects, devices described herein and/or devices implementing methods described herein may be used for applications concerning signal detection/classification, imaging, data compression, and Magnetic Resonance Imaging (MRI), among other applications. Benefits may include improved signal fidelity and superior recognition performance. Data processing pursuant to the present disclosure may be utilized in low power sensors within the BAN 300 for healthcare and fitness applications. One aspect of the BAN 300 in healthcare applications is to provide a reliable communication link between sensors (i.e., transmitters and/or encoders) and an aggregator (i.e., a receiver and/or a decoder), while reducing sensor power and communication latency. In other aspects, these benefits are provided between sensors (i.e., a transmitter and/or encoder) and a remote device (i.e., a receiver and/or a decoder), for example a base station, cell phone, PDA, or computer. Signals transmitted from the aggregator may be used to track or monitor health, well-being, and/or fitness. For example, signals from one or more of the sensors 302-308 may be transmitted to the aggregator 310, which may transmit, via a cellular network, information associated with those signals or those sensors to a medical facility where a medical professional may monitor the signals. In this way, a doctor or nurse, for example, may be able to detect any abnormal health conditions of an individual wearing the sensors.

Figure 6A:
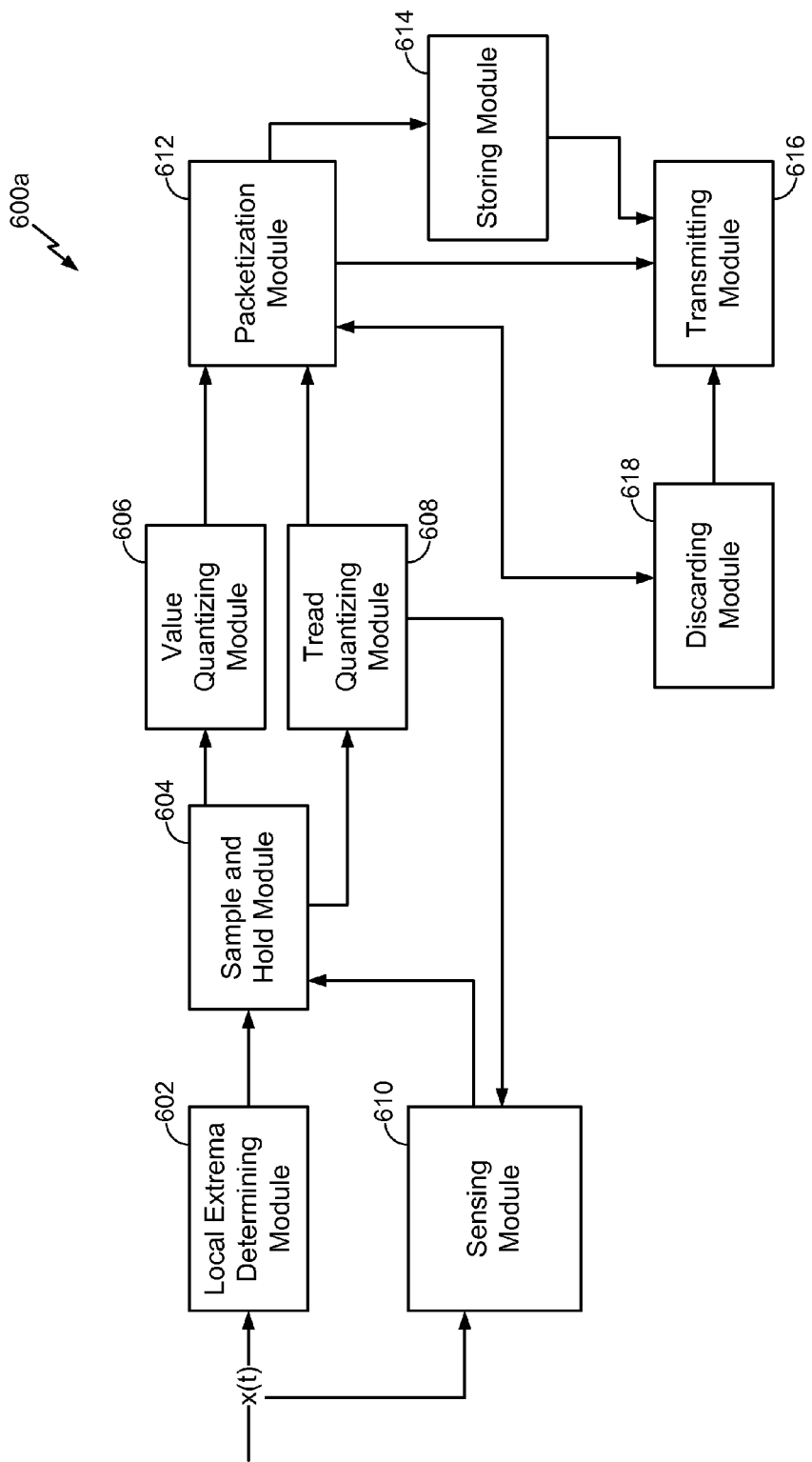
FIG. 6A is a functional block diagram illustrating a sensor used within the BAN of FIG. 3 for an analog signal.

FIG. 6A is a functional block diagram illustrating an aspect of a sensor 600*a* for use within the BAN 300 illustrated in FIG. 3 for an analog signal x(t). The sensor 600*a* may comprise any of the sensors 302-308 discussed above with respect to FIG. 3. Also as discussed above, the sensor 600*a* may be implemented as a wireless device, for example as a wireless device 202 illustrated in FIG. 2. The sensor 600*a* may be used to communicate with the aggregator 310.

The sensor 600*a* may be used to sense biomedical information. As discussed above, the sensor 600*a* may sense PPG, ECG, or accelerometer information, among other types of information. For example, the sensor 600*a* may comprise components to implement a pulse oximeter or may comprise a three dimensional accelerometer. In some aspects, the sensor 600*a* may comprise a transducer configured to convert energy, such as wave energy, into an electrical signal. The signal x(t) may represent biomedical information, and may comprise a PPG or ECG signal, for example. In the aspect illustrated in FIG. 6A, the signal x(t) is analog, as described above with respect to the discussion of compressed sensing (CS).

The sensor 600*a* may comprise a local extrema determining module 602 used to identify local extrema of the signal x(t). In one embodiment, the local extrema determining module 602 is configured to determine local minima and local maxima by determining points of the signal x(t) where the derivative is substantially equal to zero (x'(t)=0). For example, the local extrema determining module 602 may identify the circled points in FIG. 7, which illustrates a portion of the signal 500.

Those of skill in the art will appreciate that the local extrema determining module 602 may be configured to determine the points of the signal x(t) comprising a local extrema using any number of techniques, for example by tracking when a signal switches between being concave upwards or downwards, by identifying points where the signal has a zero derivative, and/or by comparing values of the points, among other techniques.

The sensor 600*a* may further comprise a sample and hold module 604 used to sample the signal x(t) at a selected point. In the aspect illustrated in FIG. 6A, the sample and hold module is configured to sample the signal x(t) at the local extrema identified by the local extrema determining module 602. The sample may be held by the sample and hold module 604 for subsequent quantization or for use in determining other points to sample. In one aspect, the value of a point determined by the sample and hold module 604 comprises a voltage at that point. For example, when value is measured in millivolts, the sampled value of point 702 illustrated in FIG.

7 is approximately 17. Those of skill in the art will appreciate other aspects of the value of a point.

The sensor 600a may further comprise a value quantizing module 606 used to quantize a sampled value of the signal x(t) from the sample and hold module 604. The quantized value of a sampled point may be represented in any number of formats. In some aspects, the value is represented as a plurality of bits. In one aspect, the values are quantized as q bits, for some integer q, and the value quantizing module 606 comprises a q-bit non-uniform quantizer, for example a log companding quantizer. In other aspects, the value quantizing module comprises a q-bit uniform quantizer. As an example, if the value is measured in microvolts, and q=8 bits, then the value at point 702 illustrated in FIG. 7 would be represented as 10101010.

Figure 7:
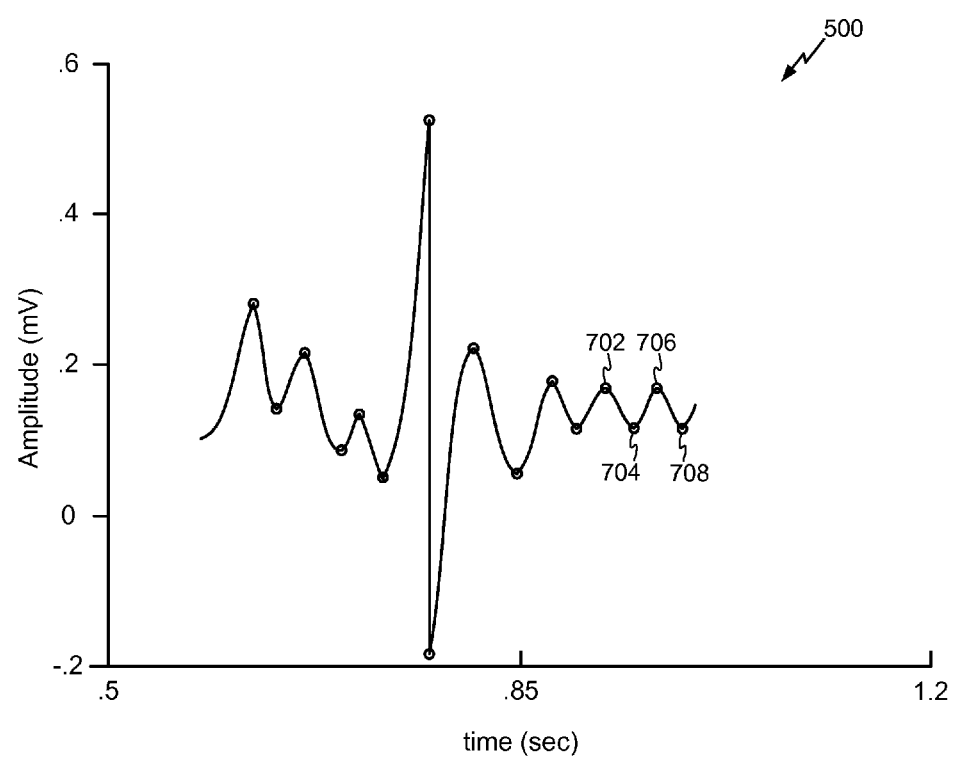
FIG. 7 illustrates points in a portion of the ECG signal of FIG. 5, where the portion of the signal is analog.

The sensor 600a may further comprise a tread quantizing module 608 used to quantize a tread of the signal x(t) with respect to the samples from the sample and hold module 604. The separation between adjacent samples may be referred to as a tread or a tread value. Tread may be computed as the difference between the location of a point and the location of an adjacent point. The unit of tread may be time and may be represented, for example, in microseconds, milliseconds, number of samples, number of clock cycles, or by another such unit of time. The tread quantizing module 608 may be configured to quantize the tread of each sample in relation to an immediately preceding sample. In one aspect, the tread of a point is determined as an amount of time that has elapsed since the previous point. For example, when tread is measured in milliseconds, the tread at point 702 illustrated in FIG. 7 is approximately 50. In another aspect, the tread of a sample is determined as a number of clock cycles that have elapsed between that sample and the adjacent sample. In another aspect, the tread of a sample is determined as a scaled value of the number of clock cycles that have elapsed between that sample and the adjacent sample. In one aspect, the adjacent sample may be the preceding sample or the following sample. Those of skill in the art will appreciate other embodiments of the tread of a sample.

The quantized tread of a sampled point may be represented in any number of formats. In some aspects, the tread is represented as a plurality of bits. In one aspect, treads are quantized as p bits, for some integer p. For example, if tread is measured in milliseconds, as discussed above, and p=7 bits, then the tread of point 702 would be represented as 0110010. In some aspects, the tread quantizing module 608 comprises a binary counter.

Figure 8:
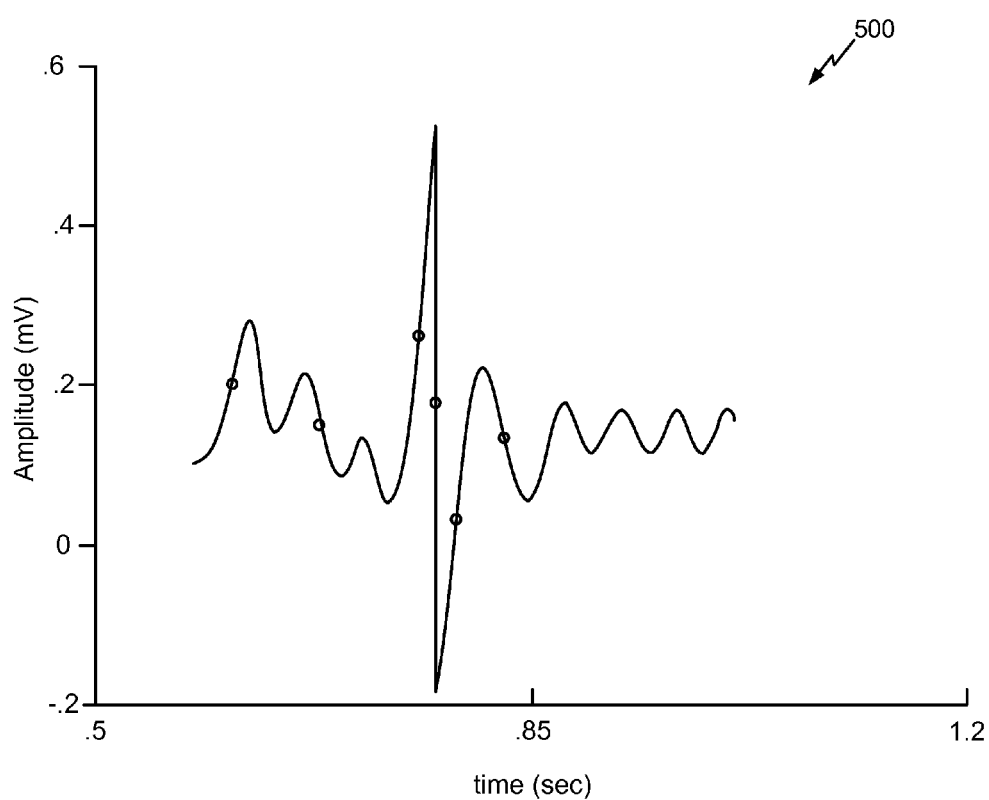
FIG. 8 illustrates points in a portion of the ECG signal of FIG. 5, where the portion of the signal is analog.

The sensor 600a may further comprise a sensing module 610 used to identify points in addition to the local extrema in the signal x(t). In the aspect illustrated in FIG. 6A, the sensing module 610 is configured to identify points of the signal x(t) where an absolute rise of the signal x(t) is greater than a first threshold, which may be referred to as T1. The rise of the signal x(t) is generally a magnitude of change of the signal x(t). For analog signals, the rise may thus be conceptualized as the absolute value of the difference between the signal x(t) and signal x(t+τ), where τ is a small value of time. For example, the points where the rise of the portion of the signal 500 is large are illustrated in FIG. 8 as being identified by circles. The sensing module 610 may be configured to determine the absolute rise at a point using any number of techniques, for example by determining a derivative of the signal x(t) at that point. In such aspect, the sensing module may identify a point when $|x'(t)|>T1$. The points identified by the sensing module 610 as having an absolute rise greater than T1 may be sampled by the sample and hold module 607, and the value and tread of the points may be quantized by the value quantizing module 606 and the tread quantizing module 608, respectively.

The sensing module 600a may further be configured to identify points in the signal x(t) such that no two points are separated by more than a maximum separation, for example a certain maxTread value. Thus, the sensing module 610 may identify points such that the tread of any sample is less than maxTread. The points identified by the sensing module 610 to ensure that tread is less than maxTread may be sampled by the sample and hold module 607, and the value and tread of the points may be quantized by the value quantizing module 606 and the tread quantizing module 608, respectively. Those of skill in the art will appreciate that processing of a signal x(t) by the sensor 600a is integral to sensing of the signal x(t).

In some aspects, the set of the quantized tread and the quantized value of a sampled point is referred to as a measurement of that point or a measurement at that point. Although reference may hereinafter be made to a measurement of a point, those of skill in the art will appreciate that the aspects described herein are not limited to only quantizations of a tread and a value. In some aspects, the tread quantizing module 608 is configured to quantize the tread based on an elapsed time since a previous measurement.

The sensor 600a may further comprise a packetization module 612 used to generate one or more packets comprising measurements from the value quantizing module 606 and the tread quantizing module 608, or comprising information indicative of the measurements. This may be referred to as packetizing the measurements. Those of skill in the art will recognize methods of packetizing the measurements, for example for storage in a storing module 614 or for transmitting over a network by a transmitting module 616.

The sensor 600a may further comprise a discarding module 618 used to discard certain ones of the measurements. In certain aspects, discarding comprises ignoring measurements received from the value quantizing module 606 and the tread quantizing module 608. For example, the discarding module 618 may receive a measurement, determine that the measurement is to be discarded, and then refrain from instructing the packetization module 612 to store the measurement in the storing module 614 or refrain from forwarding the measurement for transmission by the transmitting module 616. In other aspects, the discarding comprises a proactive action, for example instructing the packetization module 612 to delete a measurement from the storing module 614.

The discarding module 610 may be configured to discard measurements that appear substantially periodic. For example, the discarding module 618 may be configured to selectively discard one or more measurements based on a comparison of the treads and values of these measurements with the treads and values of at least one other measurement. In some aspects, at least one measurement of a set of measurements having a similar tread and also having a similar value may be discarded by the discarding module 618. The discarding module 618 may be configured to discard the measurement if the differences between the values of the measurements are within a second threshold, for example T2, and if the differences in the treads of the measurements in the set are substantially equal (or are within a third threshold). The second and third thresholds may be similar or different, and may be different than the first threshold discussed above with respect to the sensing module 610.

The storing module 614 is used to store data, for example packetized measurements from the packetization module 612. A portion or all of the data may be for transmission, for example by the transmitting module 616 to the aggregator 310. The data may comprise any combination of information, bits, symbols, or other data or representations. The storing module 614 may be implemented using the memory 206 described above with respect to FIG. 2. In some embodiments, the storing module 614 comprises a data buffer or a memory array, or other data structure, configured to store data. The storing module 614 may comprise a plurality of these elements as well. The storing module 614 may comprise processing module cache, including a multi-level hierarchical cache in which different levels have different capacities and access speeds. The storing module 614 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

One or more of the measurements may be stored in the storing module 614. In some embodiments, the complete set of measurements or the complete set of non-discarded measurements is stored in the storing module 614. The measurements may be represented by any number of means. For example, each of the tread and the value may be represented by a set of bits, or may be represented by a code. In one aspect, the storing module 614 or a portion thereof comprises a non-volatile memory such as flash memory or a hard drive configured to store measurements for future access or transmission by the sensor 600a. In some aspects, the sensor 600a further comprises a volatile memory such as RAM configured to temporarily store points, samples, and/or measurements while being processed by the sensor 600a.

The transmitting module 616 is used to transmit the measurements which have not been discarded by the discarding module 618. The non-discarded measurements may be received from the discarding module 608, or may be read from the storing module 614. In some aspects, the transmitting module 612 is configured to wirelessly transmit the measurements or information indicative thereof, for example to the aggregator 310. The transmitting module 616 may be implemented using a transmitter, for example the transmitter 210 illustrated in FIG. 2, or a combination of transmitters. The transmitting module 616 may be implemented in a transceiver, and may comprise a modulator and/or a transmission data processor. In some embodiments, the transmitting module 616 comprises an antenna and a transceiver. The transceiver may be configured to modulate outbound wireless messages going to the aggregator 310. The messages may be transmitted via the antenna and may include information indicative of non-discarded measurements. The antenna may be configured to communicate with the aggregator 310 over one or more carriers and one or more channels.

Figure 6B:
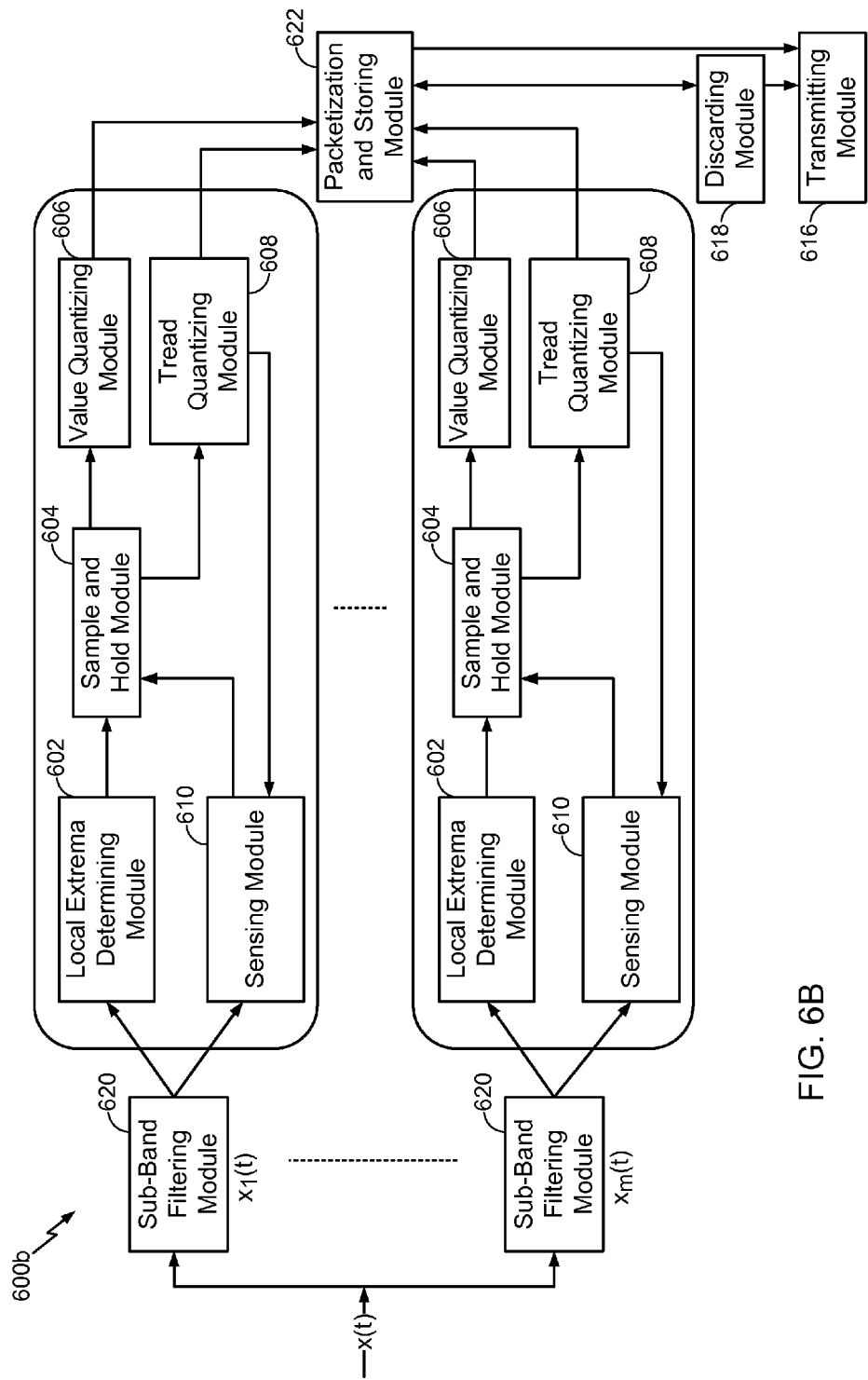
FIG. 6B is a functional block diagram illustrating a sensor used within the BAN of FIG. 3 for an analog signal having a plurality of sub-bands.

FIG. 6B is a functional block diagram illustrating an aspect of a sensor 600b for use within the BAN 300 illustrated in FIG. 3 for an analog signal x(t) having a plurality of sub-bands. The sensor 600b may comprise any of the sensors 302-308 discussed above with respect to FIG. 3. Also as discussed above, the sensor 600b may be implemented as a wireless device, for example as a wireless device 202 illustrated in FIG. 2. The sensor 600b may be used to communicate with the aggregator 310. The sensor 600b may be used to sense biomedical information.

The sensor 600b may comprise a plurality of sub-band filtering modules 620 used to decompose the signal x(t) into a plurality of sub-bands $x_1(t)$-$x_m(t)$. Each of the sub-band filtering modules 620 may be configured to isolate a sub-band of the signal x(t) for further processing. The sub-band filtering modules 620 may be configured to decompose the signal into a plurality of sub-bands using a discrete cosine transform (DCT) or an empirical mode decomposition (EMD), for example. Those of skill in the art will recognize other procedures that may be used or other ways in which the sub-band filtering modules 620 may be configured to decompose the signal x(t) into a plurality of sub-bands.

Each sub-band $x_1(t)$-$x_m(t)$ is passed to a local extrema determining module 602 and sensing module 610. Each of the sub-bands $x_1(t)$-$x_m(t)$ may be processed similar to the way in which the signal x(t) was described as being processed with respect to FIG. 6A. Thus, modules 602, 604, 606, 608, and 610 for each sub-band $x_1(t)$-$x_m(t)$ are configured as described above with respect to FIG. 6A.

Measurements for all of the sub-bands $x_1(t)$-$x_m(t)$ may be packetized and stored by a packetization and storing module 622. Those of skill in the art will appreciate that the packetization and storing module 622 may be implemented as a single module, as illustrated in FIG. 6B, or may be implemented as at least two separate modules, for example as a packetization module and a separate storing module. The packetization and storing module 622 is configured to packetize and/or store measurements for each of the sub-bands $x_1(t)$-$x_m(t)$, and is otherwise configured similar to the packetization module 612 and the storing module 614 described with respect to FIG. 6A. The discarding module 618 and the transmitting module 616 are configured as described with respect to FIG. 6A. Those of skill in the art will recognize that although one packetization and storing module 622, one discarding module 618, and one transmitting module 616 are illustrated in FIG. 6B, a plurality of any of these modules may be implemented in the sensor 600b. For example, a separate packetization and storing module 622 may be associated with each of the sub-bands $x_1(t)$-$x_m(t)$.

Figure 6C:
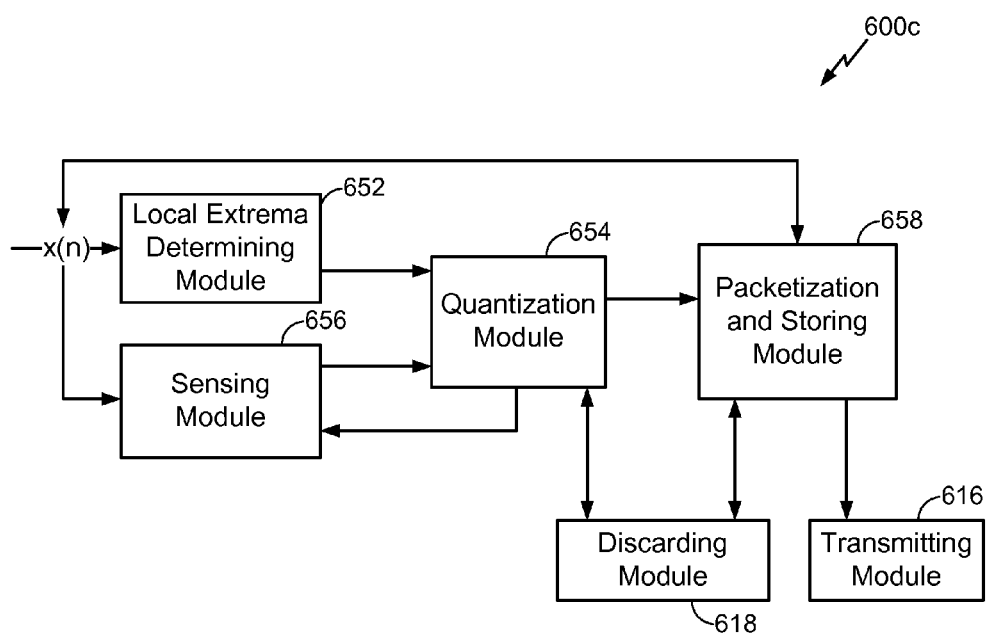
FIG. 6C is a functional block diagram illustrating a sensor used within the BAN of FIG. 3 for a discrete signal.

FIG. 6C is a functional block diagram illustrating an aspect of a sensor 600c for use within the BAN 300 illustrated in FIG. 3 for a discrete signal x(n). The sensor 600c may comprise any of the sensors 302-308 discussed above with respect to FIG. 3. Also as discussed above, the sensor 600c may be implemented as a wireless device, for example as a wireless device 202 illustrated in FIG. 2. The sensor 600c may be used to communicate with the aggregator 310. The sensor 600c may be used to sense biomedical information. In the aspect illustrated in FIG. 6C, the signal x(n) is discrete, as described above with respect to the discussion of compressed sensing (CS).

Figure 9:
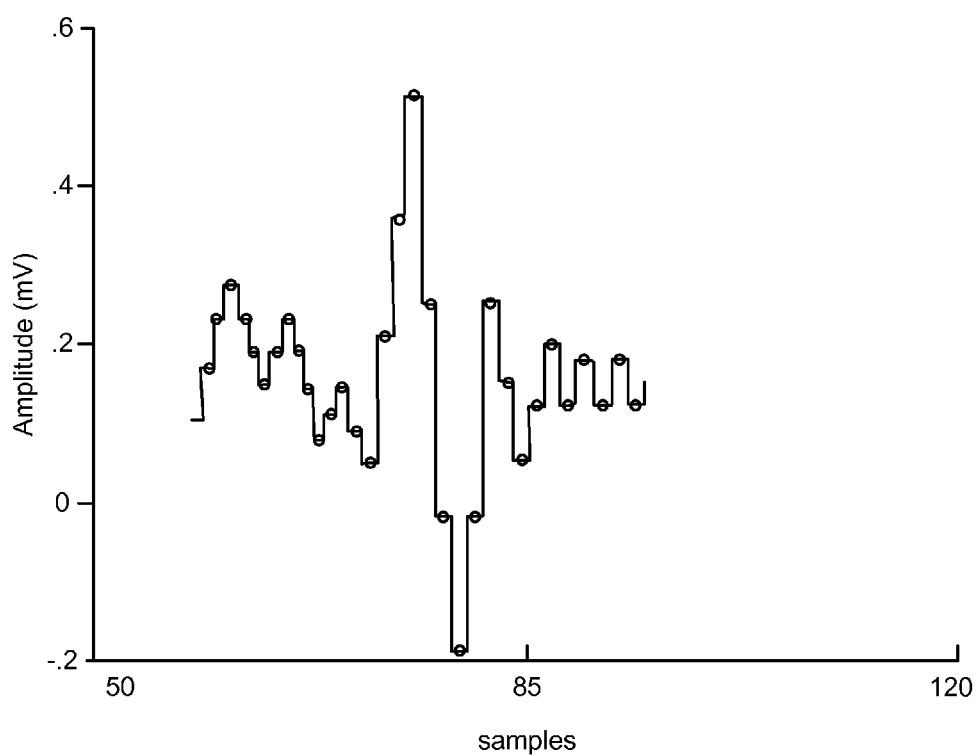
FIG. 9 illustrates points in a portion of the ECG signal of FIG. 5, where the portion of the signal is discrete.

The sensor 600c may comprise a local extrema determining module 652 used to identify local extrema of the signal x(n). The local extrema determining module 652 may be configured to perform similar functionality as the local extrema determining module 602, but for discrete signals. For example the local extrema determining module 652 may identify points of the signal x(n) where the derivative of the signal is equivalent to zero, as shown by the circled points in FIG. 9, which illustrates a discrete version of a portion of the signal 500. Those of skill in the art will appreciate that the local extrema determining module 652 may be configured to determine the points of the signal x(n) comprising a local extrema using any number of techniques, for example by comparing values of the points, among other techniques.

The sensor 600c may further comprise a quantization module 654 used to determine the value of a point identified by the local extrema determining module 652, and to quantize a tread of the point. In one aspect, the value may be determined as a level of the signal x(n) or may be indicated by a code value of the signal x(n). Those of skill in the art will appreciate this in such aspect, this determined value may be in a quantized form due to the discrete nature of the signal x(n).

The tread may comprise a separation between adjacent points. In one aspect, the tread comprises a number of clock cycles that have elapsed between a point and an adjacent point. The adjacent point may be the preceding point or the following point. Those of skill in the art will appreciate other embodiments of the tread of a sample. As described above, the quantized tread of a sampled point may be represented in any number of formats. In some aspects, the tread is represented as a plurality of bits.

The sensor 600c may further comprise a sensing module 656 used to identify points in addition to the local extrema in the signal x(n). The sensing module 656 may be configured to perform similar functionality as the sensing module 610, but for discrete signals. For example, the sensing module 656 may be configured to identify points of the signal x(n) where an absolute rise of the signal x(n) is greater than the first threshold, T1. For discrete signals, the rise may be conceptualized as the difference between a value of a point and the value of an adjacent point. The sensing module 656 may further be configured to identify points in the signal x(n) such that no two points are separated by more than a maximum separation, for example maxTread. A value of the points identified by the sensing module 656 may be determined by the quantization module 654 and the tread of these points may be quantized by the quantization module 654.

In some aspects, the set of the quantized tread and the determined value of a point is referred to as a measurement of that point or a measurement at that point. In some aspects, the quantization module 654 is configured to quantize the tread based on an elapsed time since a previous measurement. Measurements from the quantization module 654 may be packetized and stored by a packetization and storing module 658. Those of skill in the art will appreciate that the packetization and storing module 658 may be implemented as at least two separate modules, for example as a packetization module and a separate storing module. The packetization and storing module 658 may be configured to packetize and/or store measurements similar to the packetization module 612 and the storing module 614 described with respect to FIG. 6A. The discarding module 618 and the transmitting module 616 are configured as described with respect to FIG. 6A.

Figure 6D:
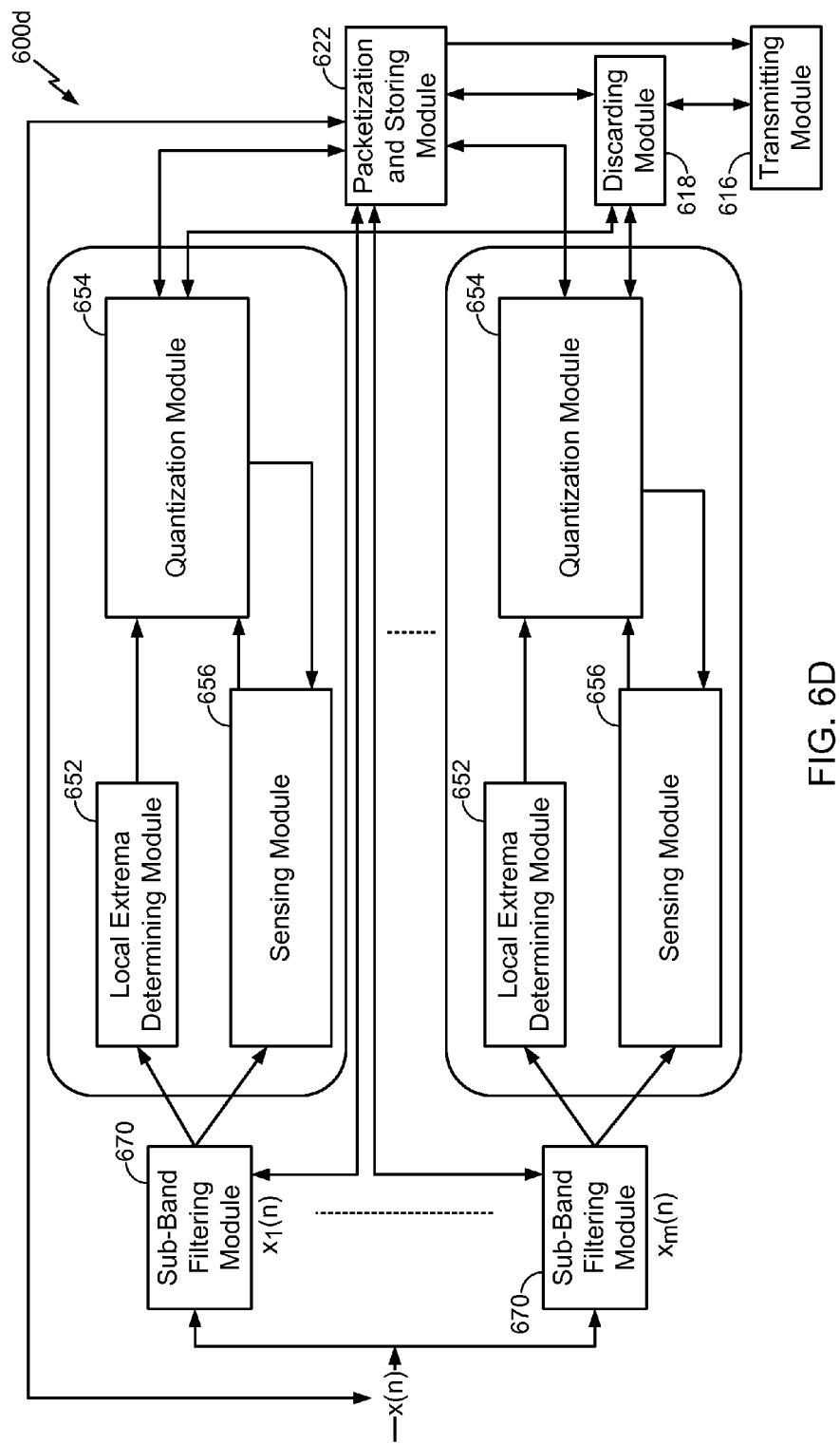
FIG. 6D is a functional block diagram illustrating a sensor used within the BAN of FIG. 3 for a discrete signal having a plurality of sub-bands.

FIG. 6D is a functional block diagram illustrating an aspect of a sensor 600d for use within the BAN 300 illustrated in FIG. 3 for a discrete signal x(n) having a plurality of sub-bands. The sensor 600d may comprise any of the sensors 302-308 discussed above with respect to FIG. 3. Also as discussed above, the sensor 600d may be implemented as a wireless device, for example as a wireless device 202 illustrated in FIG. 2. The sensor 600d may be used to communicate with the aggregator 310. The sensor 600d may be used to sense biomedical information.

The sensor 600d may comprise a plurality of sub-band filtering modules 670 used to decompose the signal x(n) into a plurality of sub-bands $x_1(n)$-$x_m(n)$. Each of the sub-band filtering modules 670 may be configured to perform similar functionality as the sub-band filtering modules 620, but for discrete signals. The sub-band filtering modules 670 may be partially or wholly implemented in the processor 204 illustrated in FIG. 2.

Each sub-band $x_1(n)$-$x_m(n)$ is passed to a local extrema determining module 652 and sensing module 656. Each of the sub-bands $x_1(n)$-$x_m(n)$ may be processed similar to the way in which the signal x(n) was described as being processed with respect to FIG. 6C. Thus, modules 652, 654, and 656 for each sub-band $x_1(n)$-$x_m(n)$ are configured as described above with respect to FIG. 6C.

Measurements for all of the sub-bands $x_1(n)$-$x_m(n)$ may be packetized and stored by the packetization and storing module 622, discarded by the discarding module 618, and/or transmitted by the transmitting module 616. The discarding module 618 and the transmitting module 616 are configured as described with respect to FIG. 6A, and the packetization and storing module 622 is configured as described with respect to FIG. 6B. Those of skill in the art will recognize that although one packetization and storing module 622, one discarding module 618, and one transmitting module 616 are illustrated in FIG. 6D, a plurality of any of these modules may be implemented in the sensor 600d. For example, a separate packetization and storing module 622 may be associated with each of the sub-bands $x_1(t)$-$x_m(t)$.

Those of skill in the art will appreciate various circuits, chips, modules, and/or components, which may comprise either software or hardware or both, that may be used to implement the modules described above with respect to the sensors 600a-600d. One or more of the modules of the sensors 600a-600d may be partially or wholly implemented in the processor 204 illustrated in FIG. 2.

Figure 10A:
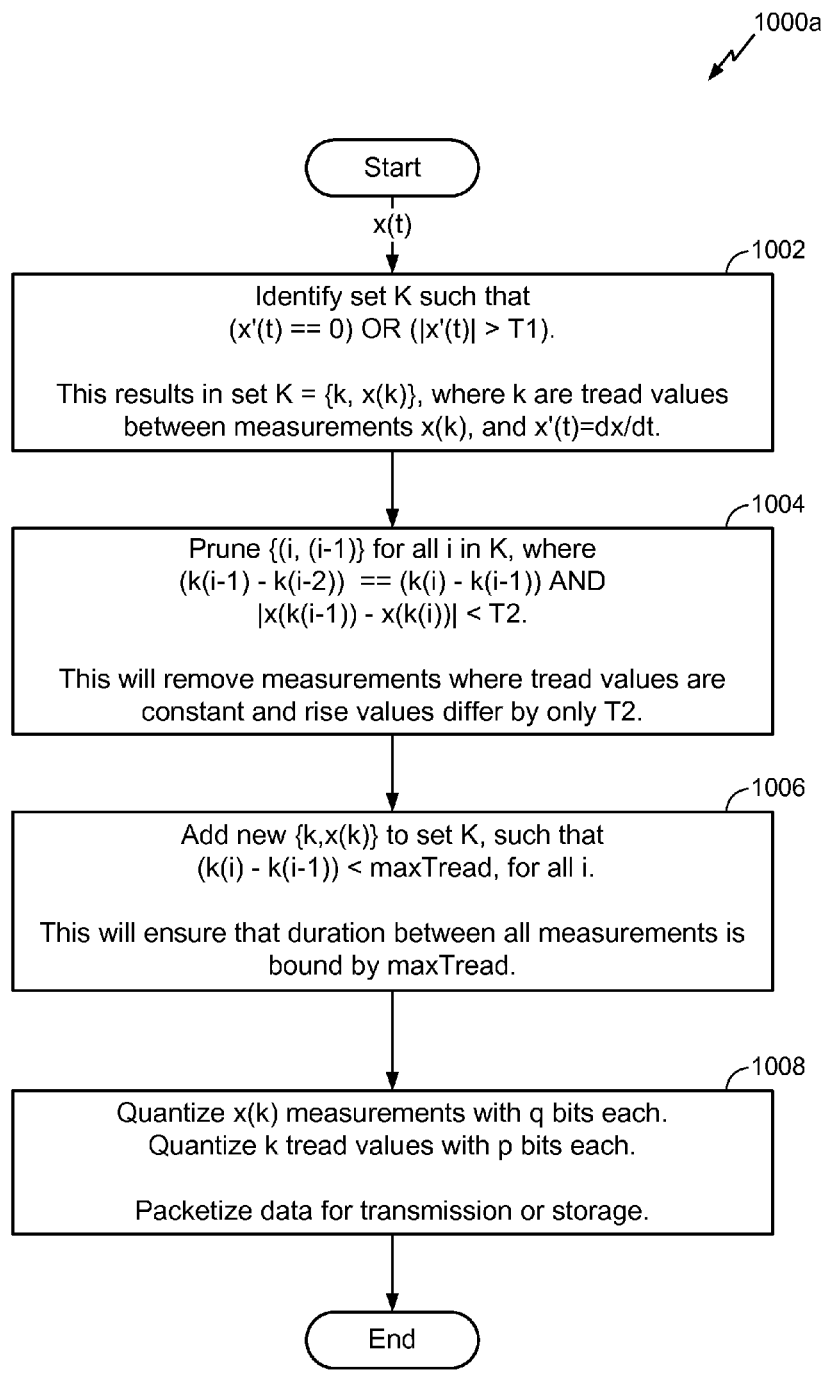
FIG. 10A is a flowchart illustrating a method of processing an analog signal at a sensor.

FIG. 10A illustrates an aspect of a method 1000a for processing an analog signal x(t). The method may be implemented by the sensor 600a, for example. Although the method below will be described with respect to elements of the sensor 600a, those of skill in the art will appreciate that other components may be used to implement one or more of the steps described herein.

At step 1002, a plurality of points may be determined such that $x'(t)=0$ or $|x'(t)|>T1$ for one or more of the plurality of points. For example, the plurality of points may be determined by the local extrema determining module 602 and the sensing module 610. The plurality of points will comprise local extrema, for example where a derivative of the signal is zero, and points where an absolute rise of the signal is greater than the first threshold. The points may be sampled by the sample and hold module 604 to generate a set K of sampled points such that K={k, x(k)}, where k are the tread values of the points between measurements x(k).

At step 1004, the samples in K may be pruned based on a comparison of the tread and/or value of the samples with at least one other sample. In one aspect, a sample is discarded when the tread of the sample is substantially equivalent to the tread of an adjacent sample, for example a nearest adjacent sample, and the value of the sample is within a threshold of the adjacent sample, for example the second threshold T2. For example, a given point designated by i may be pruned when $(k(i-1)-k(i-2))=(k(i)-k(i-1))$ & $|x(k(i))-x(k(i-1))|<T2$. As another example, the points 702, 704, 706, and 708 are located approximately the same distance apart in FIG. 7, and the absolute value of the amplitudes of the points 702, 704, 706, and 708 are approximately equivalent. When measurements are determined from samples of these points, the treads and absolute values of the measurements will be substantially equivalent. Thus, according to one aspect, one or more of the samples or measurements of the points 702, 704, 706, and 708 may be pruned, for example by the discarding module 618.

At step 1006, additional points may be determined and samples thereof may be added to the set K. For example, the sensing unit 610 may identify additional points to sample with the sample and hold module 604 and add to the set K such that no sample in K will be separated from an adjacent sample by more than maxTread. Thus, in one aspect, step 1006 comprises adding new {k,x(k)} to the set K such that $(k(i)-k(i-1))<maxTread$ for all i. In this way, each sample will be separated by a distance less than maxTread, which may reduce reconstruction errors that may occur during the decoding of data processed according to FIG. 10A. In addition, the number of bits required to quantize the tread may be bounded by $\log_2(\text{maxTread})$ bits. Thus, maxTread may have a value that is less than or equal to two raised to the power of the number of bits used to quantize the tread.

At step 1008, the samples in K are quantized, for example by the value quantizing module 606 and the tread quantizing module 608. As described above, the value and tread of a sample may be represented in any number of ways and may be quantized using any number of devices or methods. For example, the value of the samples may be quantized with q bits each using a non-uniform quantization law, and the treads may be quantized with p bits each, for example using a binary counter. The measurements comprising the quantized values and quantized treads may be packetized, for example by the packetization unit 612. The packets may be stored, for example in the storing module 614, and/or transmitted, for example by the transmitting module 616.

Figure 10B:
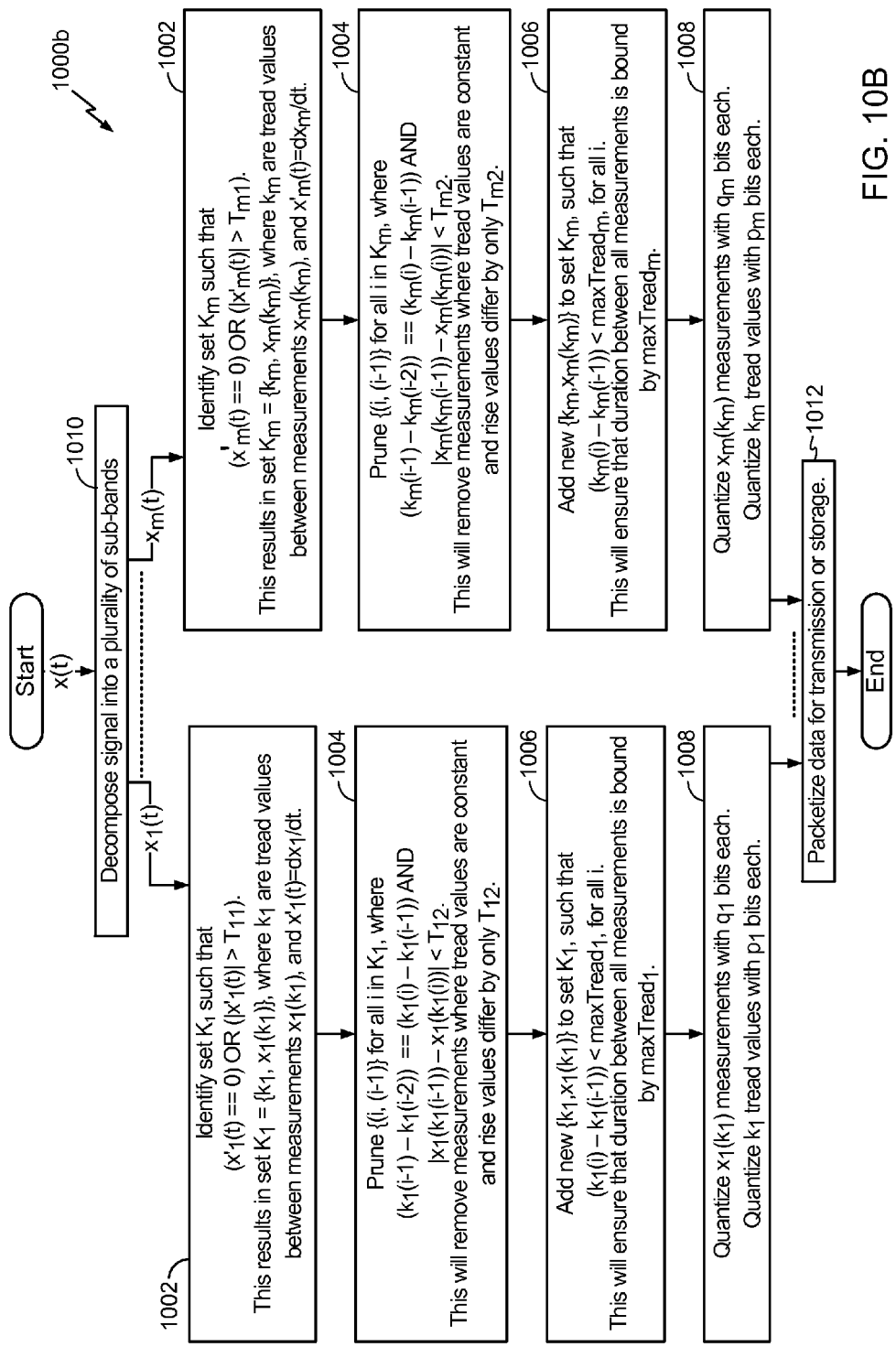
FIG. 10B is a flowchart illustrating a method of processing an analog signal having a plurality of sub-bands at a sensor.

FIG. 10B illustrates an aspect of a method 1000b for processing an analog signal x(t) having a plurality of sub-bands. The method may be implemented by the sensor 600b, for example. Although the method below will be described with respect to elements of the sensor 600b, those of skill in the art will appreciate that other components may be used to implement one or more of the steps described herein.

At step 1010, the signal x(t) may be decomposed into a plurality of sub-bands $x_1(t)$-$x_m(t)$, for example by the sub-band filtering modules 620. Processing of each sub-band $x_1(t)$-$x_m(t)$ may continue to a step 1002 after the sub-band has been isolated in step 1010. Each of the sub-bands $x_1(t)$-$x_m(t)$ may be processed similar to the way in which the signal x(t) was described as being processed with respect to FIG. 10A. Thus, steps 1002, 1004, 1006, and 1008 for each sub-band $x_1(t)$-$x_m(t)$ are performed as described above with respect to FIG. 10A.

Measurements for all of the sub-bands $x_1(t)$-$x_m(t)$ may be packetized and stored at step 1012, for example by the packetization and storing module 622, and may be transmitted, for example by the transmitting module 616. Those of skill in the art will appreciate that the packetization, storing, and/or transmitting of the measurements may be implemented as at least two separate steps, for example as a packetization step and as a storing step. The measurements may be stored and/or transmitted such that packets from two or more sub-bands are stored and/or transmitted together, or the packets for each sub-band may be maintained separately during storing and/or transmission.

The first threshold, second threshold, third threshold, p, q, and/or maxTread may be individually selected for one or more sub-bands. In some aspects, the value of one or more of the parameters T1, T2, T3, maxTread, p, and q may be the same in all sub-bands. Thus, $T_{11}$ may be approximately equivalent to $T_{m1}$. In some aspects, the value of at least one of the parameters T1, T2, T3, maxTread, p, and q in one sub-band may be different from the value of a corresponding parameter in at least another sub-band. Thus, $T_{12}$ may be different from $T_{m2}$. For example, one or more of the thresholds may be adjusted according to a source of a sub-band, or may be adjusted to more aggressively compress the sub-band.

Figure 10C:
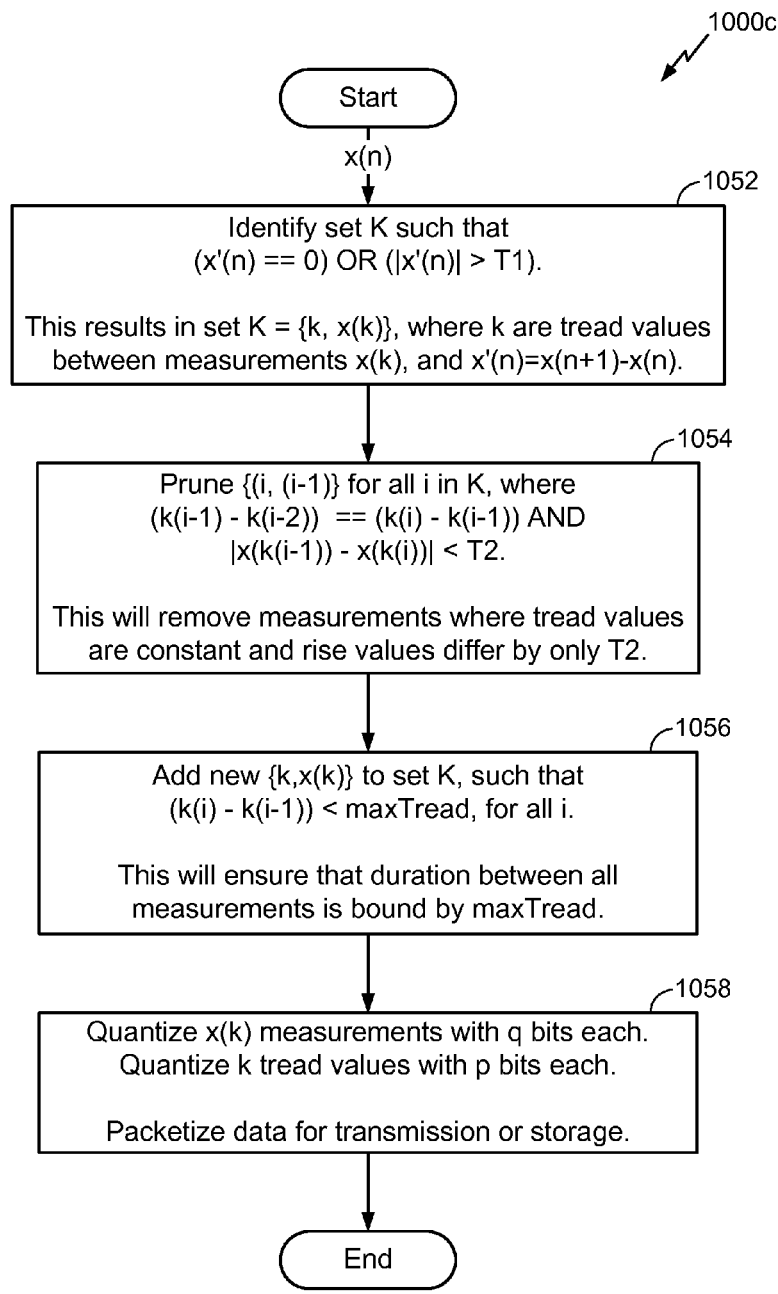
FIG. 10C is a flowchart illustrating a method of processing a discrete signal at a sensor.

FIG. 10C illustrates an aspect of a method 1000c for processing a discrete signal x(n). The method may be implemented by the sensor 600c, for example. Although the method below will be described with respect to elements of the sensor 600c, those of skill in the art will appreciate that other components may be used to implement one or more of the steps described herein.

At step 1052, a plurality of points may be determined such that x'(n)==0 or |x'(n)|>T1 for one or more of the plurality of points. For example, the plurality of points may be determined by the local extrema determining module 652 and the sensing module 656. The plurality of points will comprise local extrema, for example where a derivative of the signal is zero, and points where an absolute rise of the signal is greater than the first threshold. The absolute rise may be calculated as |x'(n)|=|x(n+1)−x(n)|. A set of points K may thus be determined, as K={k, x(k)}, from the plurality of points using the quantization module 654, where k are the tread values of the points between measurements x(k).

At step 1054, the {k, x(k)} in K may be pruned based on a comparison of the tread and/or value of the samples with at least one other sample. In one aspect, a sample is discarded when the tread of the sample is substantially equivalent to the tread of an adjacent sample and the value of the sample is within a threshold of the adjacent sample, for example the second threshold T2. The processing at step 1054 may be similar to the processing at step 1004 of FIG. 10A.

At step 1056, additional points may be determined and {k, x(k)} thereof may be added to the set K. For example, the sensing unit 656 may identify additional points to add to the set K such that no {k, x(k)} in K will be separated from an adjacent {k, x(k)} by more than maxTread. Thus, in one aspect, step 10056 comprises adding new {k,x(k)} to the set K such that (k(i)−k(i−1))<maxTread for all i.

At step 1058, the {k, x(k)} in K are quantized, for example by the quantization module 654, if not already in a quantized form. As described above, the value and tread of a sample may be represented in any number of ways and may be determined or quantized using any number of devices or methods. The measurements comprising the quantized values and quantized treads may be packetized and stored, for example by the packetization and storing unit 622. The packets may be transmitted, for example by the transmitting module 616.

Figure 10D:
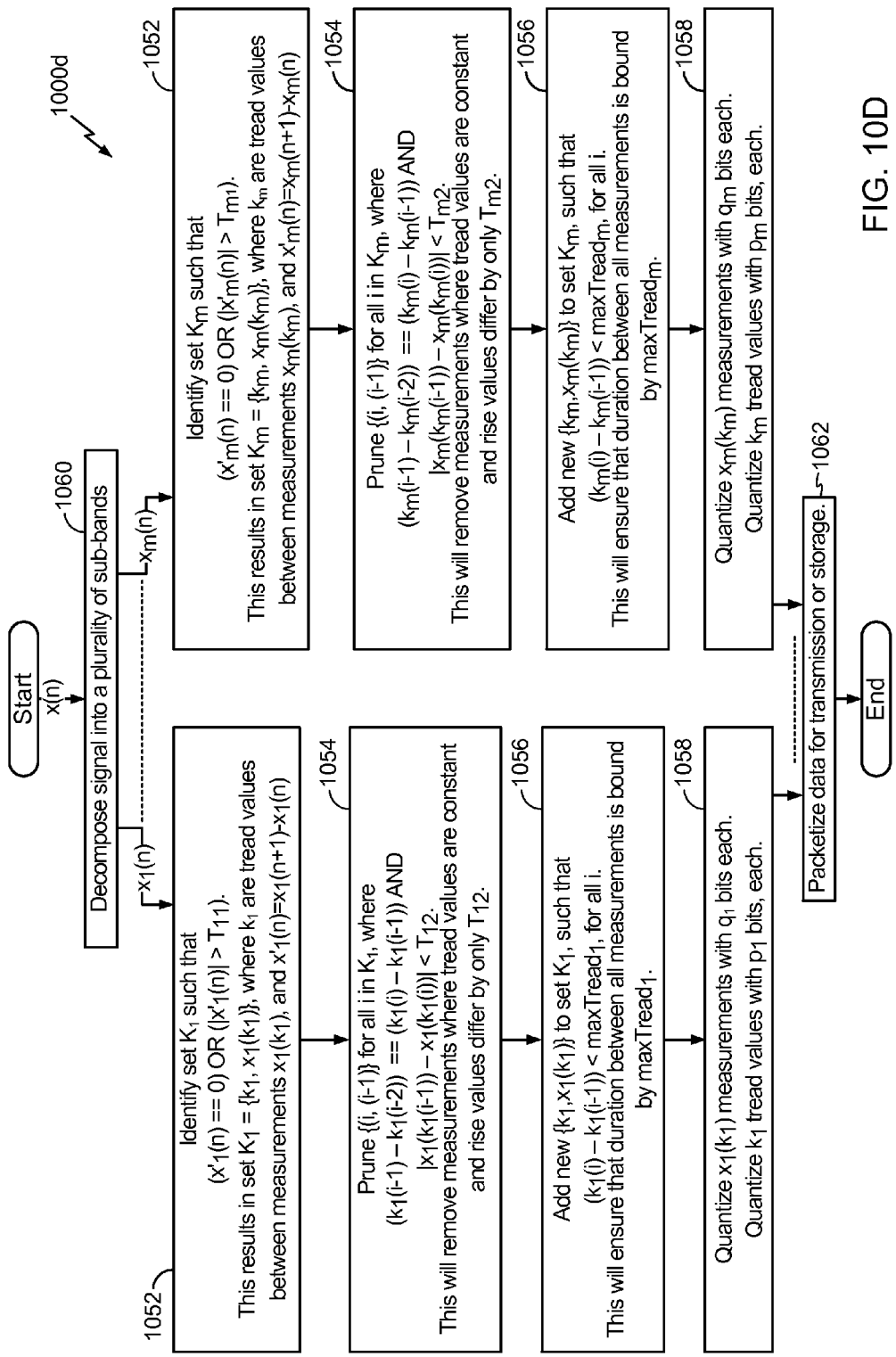
FIG. 10D is a flowchart illustrating a method of processing a discrete signal having a plurality of sub-bands at a sensor.

FIG. 10D illustrates an aspect of a method 1000d for processing a discrete signal x(n) having a plurality of sub-bands. The method may be implemented by the sensor 600d, for example. Although the method below will be described with respect to elements of the sensor 600d, those of skill in the art will appreciate that other components may be used to implement one or more of the steps described herein.

At step 1060, the signal x(n) may be decomposed into a plurality of sub-bands $x_1(n)$-$x_m(n)$, for example by the sub-band filtering modules 670. Processing of each sub-band $x_1(t)$-$x_m(t)$ may continue to a step 1052 after the sub-band has been isolated in step 1060. Each of the sub-bands $x_1(n)$-$x_m(n)$ may be processed similar to the way in which the signal x(n) was described as being processed with respect to FIG. 10C. Thus, steps 1052, 1054, 1056, and 1058 for each sub-band $x_1(n)$-$x_m(n)$ are performed as described above with respect to FIG. 10C.

Measurements for all of the sub-bands $x_1(n)$-$x_m(n)$ may be packetized and stored at step 1062, for example by the packetization and storing module 622, and may be transmitted, for example by the transmitting module 616. Those of skill in the art will appreciate that the packetization, storing, and/or transmitting of the measurements may be implemented as at least two separate steps, for example as a packetization step and as a storing step. The measurements may be stored and/or transmitted such that packets from two or more sub-bands are stored and/or transmitted together, or the packets for each sub-band may be maintained separately during storing and/or transmission.

As described above, the first threshold, second threshold, third threshold, p, q, and/or maxTread may be individually selected for one or more sub-bands. In some aspects, the value of one or more of the parameters T1, T2, T3, maxTread, p, and q may be the same in all sub-bands. Thus, $T_{11}$ may be approximately equivalent to $T_{m1}$. In some aspects, the value of at least one of the parameters T1, T2, T3, maxTread, p, and q in one sub-band may be different from the value of a corresponding parameter in at least another sub-band. Thus, $T_{12}$ may be different from $T_{m2}$. For example, one or more of the thresholds may be adjusted according to a source of a sub-band, or may be adjusted to more aggressively compress the sub-band.

Figure 11A:
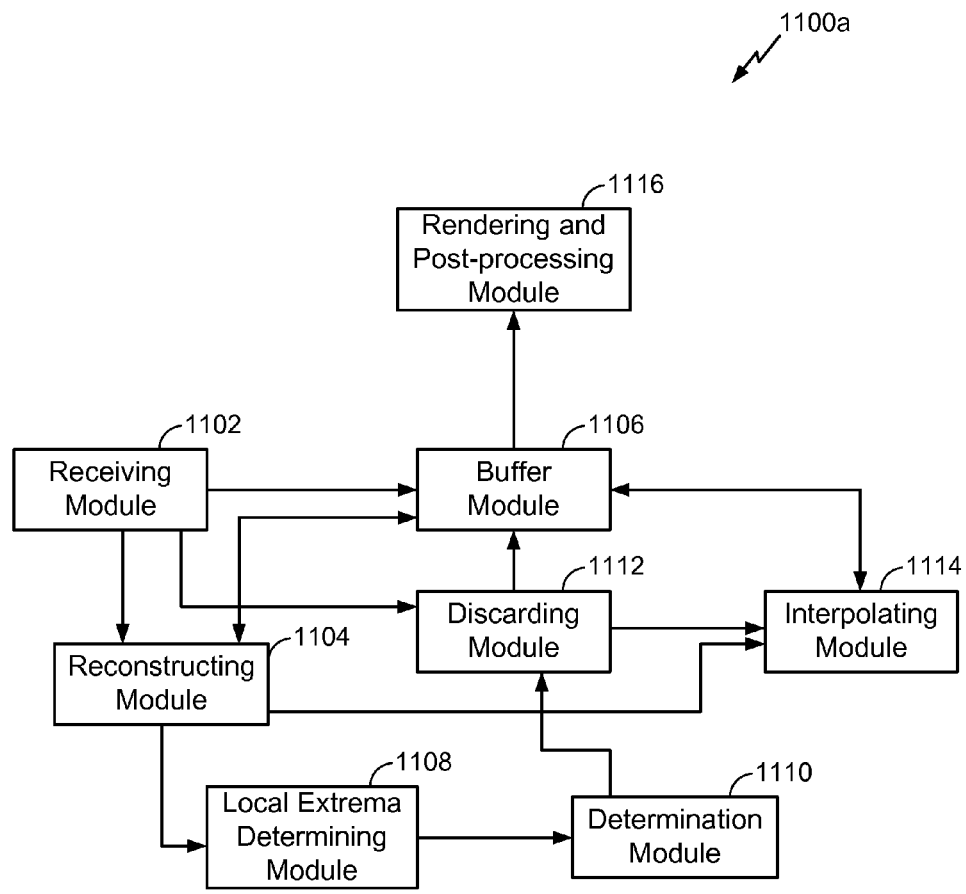
FIG. 11A is a functional block diagram illustrating an aggregator used within the BAN of FIG. 3.

FIG. 11A is a functional block diagram illustrating an aspect of an aggregator 1100a for use within the BAN 300 illustrated in FIG. 3. The aggregator 1100a may comprise the aggregator 310 discussed above with respect to FIG. 3. As discussed above, the aggregator 310 may be implemented as a wireless device, for example as the wireless device 202 illustrated in FIG. 2. The aggregator 1100a may be used to communicate with any of the sensors 302-308. In some aspects, the aggregator 1100a comprises a monitoring device, such as used in a multiparameter system (sometimes referred to as an MPS), for monitoring a patient.

The aggregator 1100a may comprise a receiving module 1102 used to receive measurements, for example as transmitted from one of the sensors 600a-600d. The measurements may include a tread and a value of points of a signal. As described above, the measurements may include data or information associated with a biomedical sensor, for example the sensors 302-308. The received measurements may be demodulated, downconverted, or otherwise processed by the receiving module 1102 or another module. In some aspects, the measurements are received in a packet form and are extracted from the packet.

The receiving module 1102 may be implemented using a receiver, for example the receiver 212 illustrated in FIG. 2, or a combination of receivers. The receiving module 1102 may be implemented in a transceiver, and may comprise a demodulator and/or a receive data processor. In some embodiments, the receiving module 1102 comprises an antenna and a transceiver. The transceiver may be configured to demodulate inbound wireless messages from the sensors 302-308. The messages may be received via the antenna and may include information associated with biomedical information. The antenna may be configured to communicate with the sensors 302-308 over one or more carriers and one or more channels.

The aggregator 1100a may further comprise a reconstructing module 1104 used to reconstruct a signal from the received measurements. In certain aspects, the reconstructed signal is restored into a discrete domain. In some aspects, the reconstructed signal is represented as Nyquist domain data in a uniformly sampled space. The restored signal may in some aspects be represented similar to samples of an analog signal x(t) or identified values of a discrete signal x(n).

Data received using the receiving module 1102 or reconstructed using the reconstructing module 1104 may be temporarily stored in a buffer module 1106, which may comprise volatile memory such as RAM configured to temporarily store the data while being processed by the aggregator 1100a. The data may comprise any combination of information, bits, symbols, or other data or representations. In some embodiments, the buffer module 1106 comprises a data buffer or a memory array, or other data structure, configured to store data. The buffer module 1106 may comprise a plurality of these elements as well. The buffer module 1106 may comprise processing module cache, including a multi-level hierarchical cache in which different levels have different capacities and access speeds. The buffer module 1106 may also comprise random access memory (RAM), or other volatile storage devices, or non-volatile storage devices.

The aggregator 1100a may further comprise a local extrema determining module 1108 used to determine or identify local extrema in the reconstructed signal. The local extrema determining module 1108 may be configured similar to the local extrema determining module 652 illustrated in FIG. 6C. For example, the local extrema determining module 1108 may be configured to identify points where a slope of the signal is approximately zero.

The aggregator 1100a may further comprise a determination module 1110 used to determine a value and a location or tread of the extrema identified by the local extrema determining module 1108. Some or all of the functionality of the determination module 1110 may be similar to the functionality of the quantization module 654. The determination module 1110, however, may in some aspects be configured only to identify a tread of the extrema instead of quantizing the tread.

The aggregator 1100a may further comprise a discarding module 1112 used to discard spurious extrema points identified by the local extrema determining module 1108 from the reconstructed signal. In some aspects, the discarding module 1112 is configured to discard extrema based on a comparison of the value of the extrema, as determined by the determination module 1110, with a value of a corresponding measurement received using the receiving module 1102.

Figure 13:
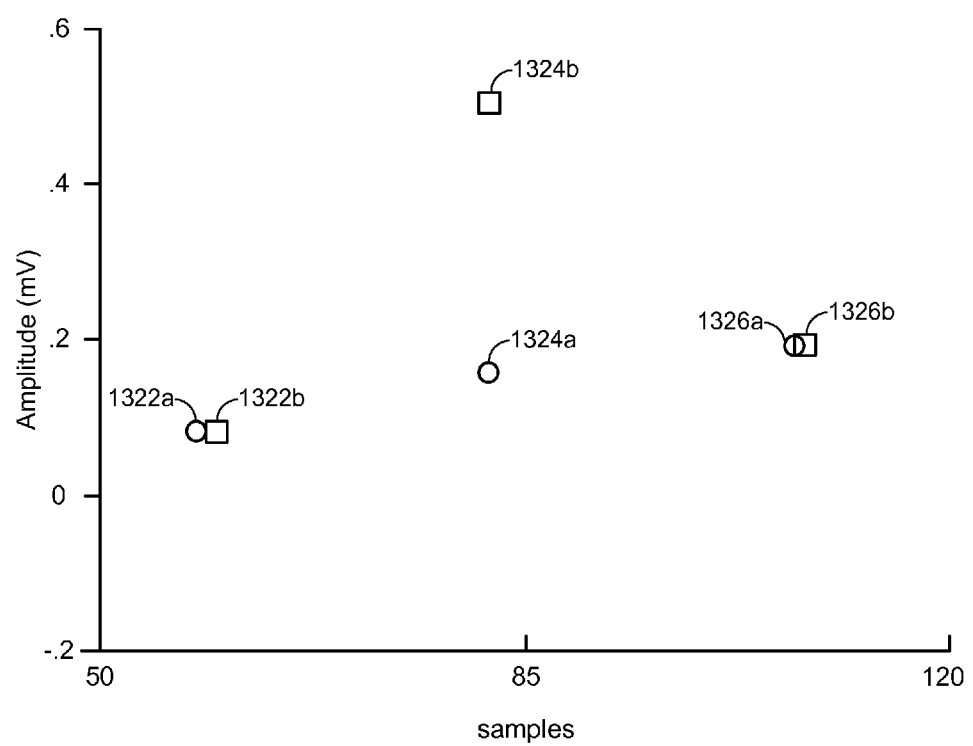
FIG. 13 illustrates samples of a reconstructed signal.

In one aspect, the discarding module 1112 is configured to identify an extremum as spurious when the difference between the value of the extremum and the value of a corresponding measurement received using receiving module 1102 is greater than some threshold, for example Delta. In FIG. 13, representations of six samples are illustrated. Samples 1322a, 1324a, and 1326a represent measurements received by the receiving module 1102 and are shown by circles. Samples 1322b, 1324b, and 1326b, represent extrema identified by the local extrema determining module 1108 and are shown by squares. The samples 1322b, 1324b, and 1326b correspond to the samples 1322a, 1324a, and 1326a, respectively. As can be seen in the example of FIG. 13, however, the value of sample 1324b differs from the value of sample 1324a by approximately 0.33 millivolts, for example. If Delta is set lower than this value, the sample 1324b will be spurious.

The aggregator 1100a may further comprise an interpolating module 1114 used to interpolate values for the extrema discarded by the discarding module 1112. Values may be interpolated based on nearby or adjacent non-discarded extrema, for example. Values may in addition or instead be interpolated based on values of the reconstructed signal that are near or adjacent. Thus, the interpolating module 1114 may be used to interpolate the signal around the spurious local extrema.

In some aspects, the non-discarded extrema (e.g., extrema remaining after the discarding) and any interpolated extrema are used by the reconstructing module 1104 to generate another version of the reconstructed signal. This other version may then be subjected to the same processing by the local extrema determining module 1108, the determination module 1110, the discarding module 1112, and the interpolating module 1114 until no spurious extrema are identified by the discarding module 1112. In this way, a reconstructed signal may be iteratively determined.

A reconstructed signal, or data indicative thereof, stored in the buffer module 1106 may be rendered by a rendering module 1116. The rendering 1116 module may be configured to render a visual representation of the signal, for example for display on a display device, or may be configured to perform other post-processing. Those of skill in the art will appreciate further processing that the rendering module 1116 may be configured to perform.

Figure 11B:
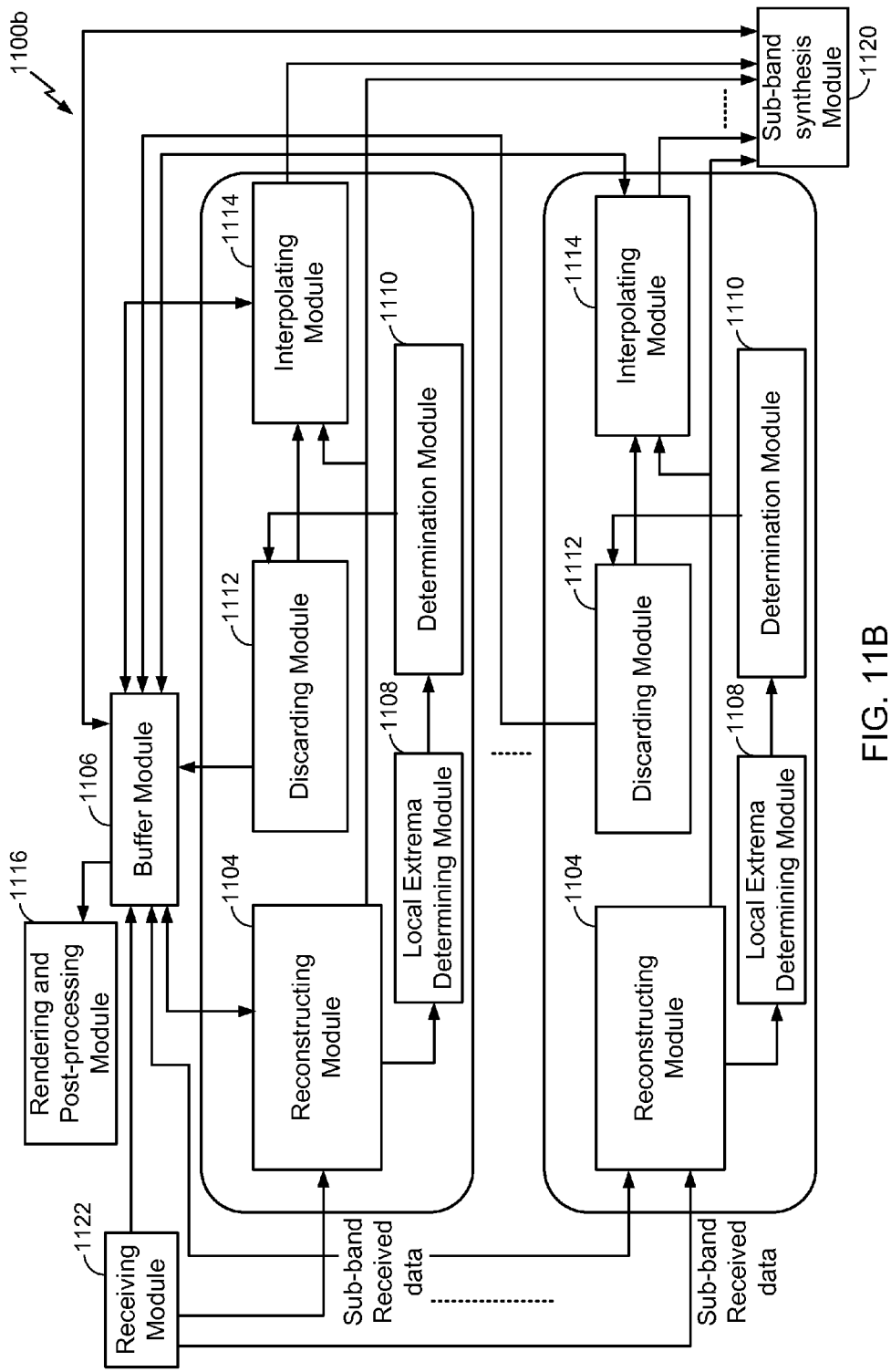
FIG. 11B is a functional block diagram illustrating an aggregator used within the BAN of FIG. 3 for a plurality of sub-bands.

FIG. 11B is a functional block diagram illustrating an aspect of an aggregator 1100b for a plurality of sub-bands for use within the BAN 300 illustrated in FIG. 3. The aggregator 1100b may comprise the aggregator 310 discussed above with respect to FIG. 3. As discussed above, the aggregator 310 may be implemented as a wireless device, for example as the wireless device 202 illustrated in FIG. 2. The aggregator 1100b may be used to communicate with any of the sensors 302-308. In some aspects, the aggregator 1100b comprises a monitoring device.

The aggregator 1100b may comprise a receiving module 1122 used to receive a plurality of sub-bands of measurements, for example from one of the sensors 600a-600d. The receiving module 1122 may otherwise be configured similar to the receiving module 1102 in FIG. 11A. Those of skill in the art will recognize that although one receiving module 1122 is illustrated in FIG. 11B, a plurality of receiving modules may be implemented in the aggregator 1100b. For example, a separate receiving module 1122 may be used to receive each respective sub-band of measurements.

A signal is reconstructed from each sub-band by a reconstructing module 1104. The modules 1104, 1106, 1108, 1110, 1112, and 1114, and 1116 are configured as described above with respect to FIG. 11A. After processing of each sub-band is completed as described in FIG. 11A, however, the signals reconstructed from each sub-band may be combined into a combined or an aggregate signal by a sub-band synthesis module 1120. The sub-bands may be combined using any number of methods or techniques compatible with the sub-band analysis performed by the sensors 302-308. Those of skill in the art will recognize procedures that may be utilized or ways in which the sub-band synthesis module 1120 may be configured to combine the reconstructed sub-bands into a combined or aggregate signal. The combined or aggregate signal may be rendered or processed further by the rendering module 1116.

Further, the aggregator 1100a and/or 1100b may be configured to transmit requests for data or for clock synchronization to one or more wireless sensors via a BAN radio. The aggregator 1100a and/or 1100b may further comprise a media access controller (MAC) coupled to the BAN radio for controlling communications through the BAN radio. The aggregator 1100a and/or 1100b may further comprise a processing system coupled to the MAC. The processing system may be configured to communicate with the sensors via the MAC and BAN radio. For example, the processing system may mitigate packet loss, remove artifacts in a received sample set, determine and mitigate clock misalignment between the aggregator 1100a and/or 1100b and the sensors, align samples sets from a plurality of sensors, and analyze received or reconstructed samples to interpret vital signs and trigger alarms.

The aggregator 1100a and/or 1100b may further comprise additional radios such as third generation (3G) radios or a WiFi radio. These radios may be used to communicate information from the aggregator to other devices. Further, the rendering and post-processing performed by the rendering module 1116 may include transmission of the reconstructed data over a 3G or a WiFi radio to a centralized repository and/or centralized processing unit. Thus, the aggregator 1100a and/or 1100b may comprise a transmitter or transceiver. For example, a person's cell phone may function as the aggregator 1100a and/or 1100b. After determining vital signs based on data from the sensors, the processing system may transmit information about the vital signs to a remotely located physician or a central database via the 3G radios or the WiFi radio. Advantageously, the centralized processing of samples from the sensors at the aggregator 1100a and/or 1100b may facilitate lower power consumption and reduced complexity in the sensors. Further, the aggregator 1100a and/or 1100b may act as a centralized clock synchronization controller for the plurality of sensors.

Those of skill in the art will appreciate various circuits, chips, modules, and/or components, which may comprise either software or hardware or both, that may be used to implement the modules described above with respect to the aggregators 1100a and 1100b. One or more of the modules of the aggregators 1100a and 1100b may be partially or wholly implemented in the processor 204 illustrated in FIG. 2.

Although described separately, it is to be appreciated that functional blocks described with respect to the sensors 600a-600d and the aggregators 1100a and 1100b need not be separate structural elements. For example, two or more of the local extrema determining module 602, sample and hold module 604, value quantizing module 606, tread quantizing module 608, sensing module 610, packetizing module 612, discarding module 618, sub-band filtering module 620, and packetization and storing module 622 may be embodied in a single chip. Similarly, two or more of the reconstructing module 1104, local extrema determining module 1108, determination module 1110, discarding module 1112, interpolating module 1114, rendering module 1116, and sub-band synthesis module 1120 may be embodied in a single chip, for example. In addition, modules besides the storing modules may contain memory, such as registers. Similarly, one or more of the functional blocks or portions of the functionality of various blocks may be embodied in a single chip. Alternatively, the functionality of a particular block may be implemented on two or more chips. In addition, additional modules or functionality may be implemented in the sensors 600a-600d and the aggregators 1100a and 1100b. Similarly, fewer modules or functionalities may be implemented in the sensors 600a-600d and the aggregators 1100a and 1100b, and the components of the sensors 600a-600d and/or the aggregators 1100a and 1100b may be arranged in any of a plurality of configurations. Additional or fewer couplings between the various modules illustrated in FIGS. 6A-6D and 11A and 11B or between additional modules may be implemented.

Figure 25:
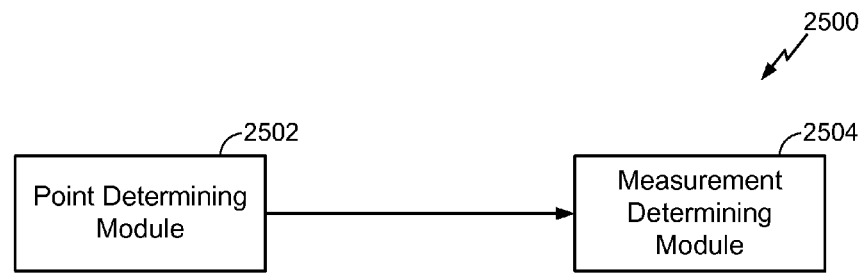
FIG. 25 is a functional block diagram illustrating a sensor used within the BAN of FIG. 3.

For example, FIG. 25 is a functional block diagram illustrating an aspect of a sensor 2500 comprising fewer modules than the sensors 600a-600d shown in FIGS. 6A-6D. The sensor 2500 may comprise any of the sensors 302-308, and may be used to communicate with the aggregator 310. The sensor 2500 may comprise a point determining module 2502 used to determine a plurality of points in a signal, for example the signal x(t) or x(n) discussed above. In some aspects, the point determining module 2502 is configured to identify the plurality of points such that at least one point of the plurality of points comprises a local maximum or a local minimum of the signal or a point having a value of the signal that when comparing to a value of another point of the signal yields a difference being greater than a first threshold (e.g., T1). In one aspect, the point determining module 2502 implements functionality of the local extrema determining module 602, the sensing module 610, local extrema determining module 652, and/or the sensing module 656. The sensor 2500 may further comprise a measurement determining module 2504 used to determine at least one measurement. As described above, the measurement may comprise a quantized signal value at one of the plurality of points and a quantized tread at that one point. In some aspects, the measurement determining module 2504 implements functionality of the value quantizing module 606, tread quantizing module 608, packetization module 612, quantization module 654, and/or packetization and storing module 658. Those of skill in the art will appreciate that the sensor 2500 may further comprise one or more of the modules illustrated with respect to the sensors 600a-600d.

Figure 26:
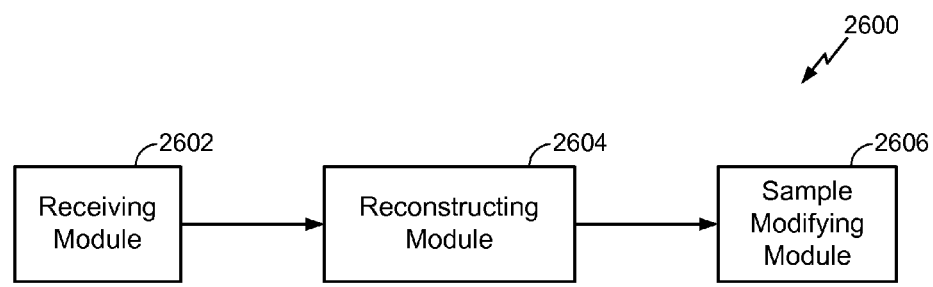
FIG. 26 is a functional block diagram illustrating an aggregator used within the BAN of FIG. 3.

As another example, FIG. 26 is a functional block diagram illustrating an aspect of an aggregator 2600 comprising fewer modules than the aggregators 1100a and 1100b. The aggregator 2600 may comprise the aggregator 310, and may be used to communicate with any of the sensors 302-308. The aggregator 2600 may comprise a receiving module 2602 used to receive a plurality of measurements indicative of a signal. As described above, the measurements may comprise at least a value and a tread at points of the signal. In some aspects, the receiving module 2602 implements functionality of the receiving module 1102 and/or 1122. The aggregator 2600 may further comprise a reconstructing module 2604 used to reconstruct the signal based at least in part on the plurality of measurements. In some aspects, the reconstructing module 2604 implements functionality of the reconstructing module 1104. The aggregator 2600 may further comprise a sample modifying module 2606 used to modify the value of at least one sample of the reconstructed signal based on the measurements. In some aspects, the sample modifying module 2606 implements functionality of the local extrema determining module 1108, the determination module 1110, the discarding module 1112, and/or the interpolating module 1114. Those of skill in the art will appreciate that the aggregator 2600 may further comprise one or more of the modules illustrated with respect to the aggregators 1100a and 1100b.

One or more of the functional blocks and/or one or more combinations of the functional blocks described with respect to the local extrema determining module 602, sample and hold module 604, value quantizing module 606, tread quantizing module 608, sensing module 610, packetizing module 612, discarding module 618, sub-band filtering module 620, packetization and storing module 622, reconstructing module 1104, local extrema determining module 1108, determination module 1110, discarding module 1112, interpolating module 1114, rendering module 1116, and sub-band synthesis module 1120 may be embodied as a processing system, a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the sensors 600a-600d and 2500 and the aggregators 1100a, 1100b, and 2500 may also be implemented as a combination of computing devices, e.g., a combination of a DSP and a microprocessor, a plurality of microprocessors, one or more microprocessors in conjunction with a DSP communication, or as any other such configuration or processing system.

Figure 12A:
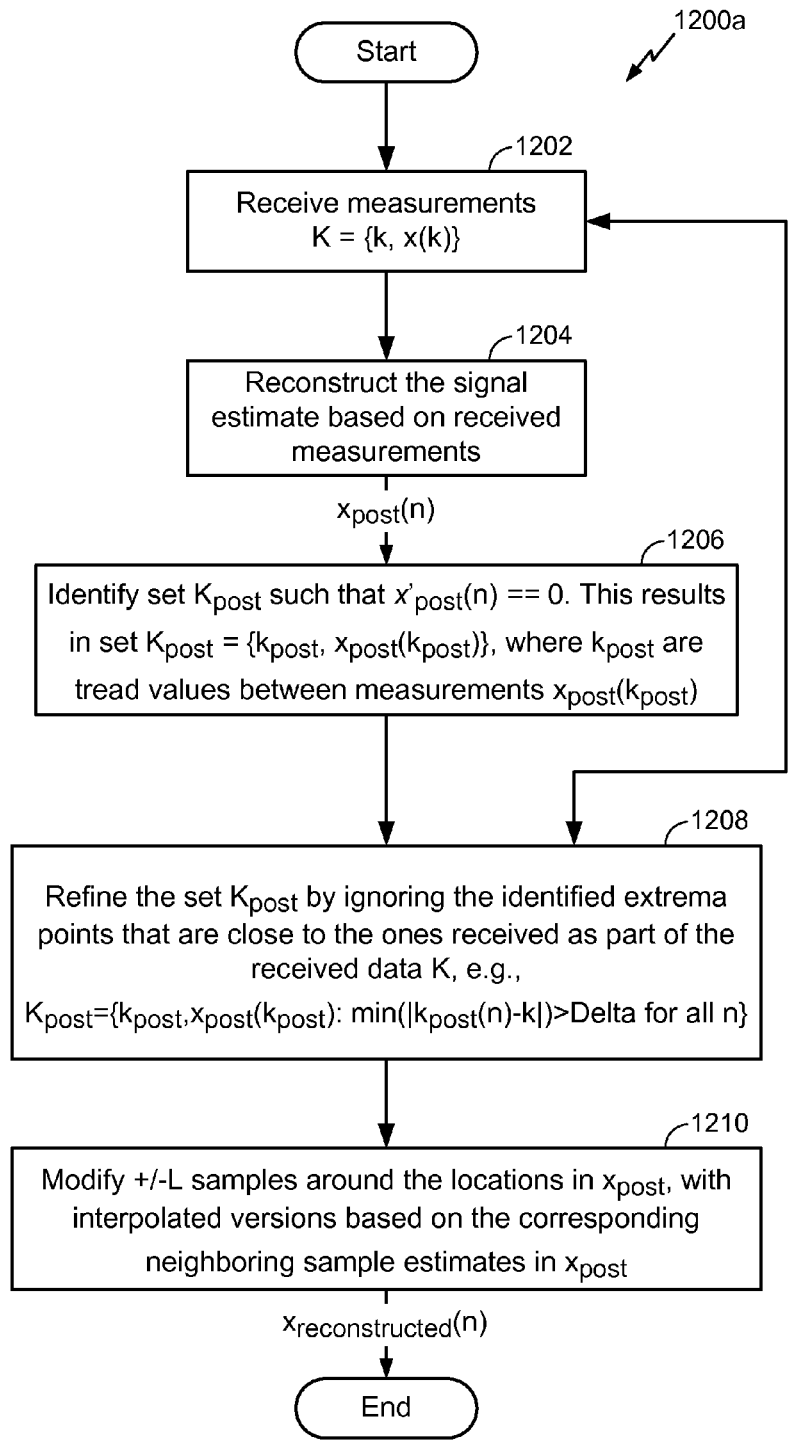
FIG. 12A is a flowchart illustrating a method of reconstructing data.

FIG. 12A illustrates an aspect of a method 1200a for decoding data. The method may be implemented by the device 1100a, for example. Although the method below will be described with respect to elements of the device 1100a, those of skill in the art will appreciate that other components may be used to implement one or more of the steps described herein.

At step 1202, a plurality of measurements are received. For example, a plurality of measurements $\{k, x(k)\}$ in a set of K measurements may be received. As described above, the measurements may comprise a tread k and a value x(k). The measurements may be received, for example, using the receiving module 1102.

At step 1204, an estimate of a signal x(n) is reconstructed as $x_{post}(n)$ based on the received measurements of K. The signal $x_{post}(n)$ may be reconstructed using the reconstructing module 1104, for example.

At step 1206, a set $K_{post}$ is determined from points where $x'_{post}(n) = 0$. This results in the set $K_{post} = \{k_{post}, x_{post}(k_{post})\}$, where $k_{post}$ are tread values between measurements $x_{post}(k_{post})$. Thus, it can be seen that the samples in $K_{post}$ may comprise local extrema of the reconstructed signal $x_{post}(n)$, and $\{k_{post}, x_{post}(k_{post})\}$ may comprise the treads and values at these local extrema. The set $K_{post}$ may be determined using the local extrema determining module 1108 and/or the determination module 1110, for example.

At step 1208, the set $K_{post}$ is refined by ignoring the identified extrema points that are close to the measurements received as part of the received data K. Thus, $K_{post} = \{k_{post}, x_{post}(k_{post}): \min(|k_{post}(n)-k|) > \text{Delta for all } n\}$. In this way, spurious extrema can be discarded based on a comparison with a corresponding received measurement, for example using the discarding module 1112.

At step 1210, a number of samples L that were discarded at step 1208 may be interpolated, for example by the interpolating module 1114. In this way, an estimate $x_{reconstructed}(n)$ of the signal x(n) may be generated. In some aspects, the signal $x_{reconstructed}(n)$ is returned for processing to the step 1204 such that the signal may be further refined. In some aspects, the signal $x_{reconstructed}(n)$ is iteratively processed according to the steps 1204-1210 until no spurious extrema are discarded at step 1208. In this way, a final $x_{reconstructed}(n)$ may iteratively be determined.

Figure 12B:
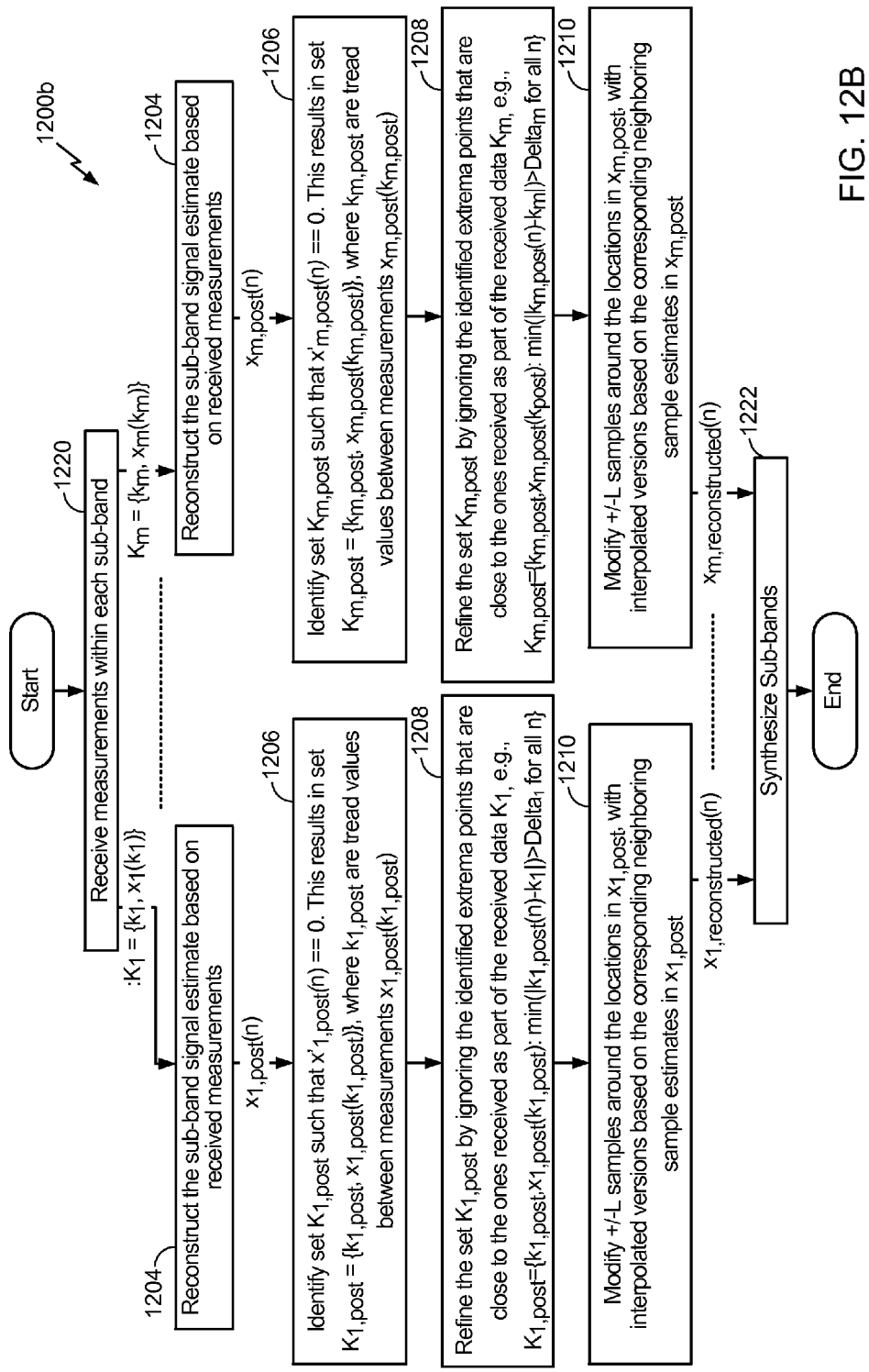
FIG. 12B is a flowchart illustrating a method of reconstructing data from a plurality of sub-bands of data.

FIG. 12B illustrates an aspect of a method 1200b for decoding data. The method may be implemented by the device 1100b, for example. Although the method below will be described with respect to elements of the device 1100b, those of skill in the art will appreciate that other components may be used to implement one or more of the steps described herein.

At step 1220, measurements for a plurality of sub-bands are received, for example using the receiving module 1122. These measurements may comprise $\{k_1, x_1(k_1)\} - \{k_m, x_m(k_m)\}$ in sets of $K_1 - K_m$ measurements. An estimate of a signal for each sub-band is reconstructed as $x_{1,post}(n) - x_{m,post}(n)$ at step 1204 based on the measurements of $K_1$-Km received at step 1220.

Each of the reconstructed signals $x_{1,post}(n) - x_{m,post}(n)$ may be processed according to the steps 1204, 1206, 1208, and 1210 described above with respect to FIG. 12A similar to the way in which $x_{post}(n)$ is processed. At step 1210, estimates $x_{1,reconstructed}(n) - x_{m,reconstructed}(n)$ of the sub-bands may be generated. In some aspects, one or more of the estimates $x_{1,reconstructed}(n) - x_{m,reconstructed}(n)$ may be returned to a respective step 1204 to be further refined. In some aspects, one or more of the estimates $x_{1,reconstructed}(n) - x_{m,reconstructed}(n)$ are iteratively processed according to the respective steps 1204-1210 until no spurious extrema are discarded at step 1208. In this way, final $x_{1,reconstructed}(n) x_{m,reconstructed}(n)$ for the sub-bands may be iteratively determined.

At step 1222, the reconstructed signal estimates $x_{1,reconstructed}(n) - x_{m,reconstructed}(n)$ for each sub-band may be combined into an aggregate signal, for example by the sub-band synthesizing module 1120. In this way, a signal may be reconstructed from a plurality of decoded sub-bands.

Simulations and Other Like Examples

The following discussion is provided by way of example to illustrate one or more advantages of the devices and methods described herein. Those of skill in the art will appreciate other advantages and/or simulations, and will understand that the following discussion is not limiting on the disclosure.

The choice of a particular data compression scheme in a given application may depend on many criteria, including for example (a) power consumption or computational complexity, (b) compression ratio, (c) distortion or compression quality and (d) algorithm latency. Each of these may be discussed below.

Encoding operations described herein may be realized with significantly lower complexity than traditional approaches. In some aspects, overall power or computational complexity may be of the same order, but for many BANs, it is beneficial to off-load computational burden from the sensor.

Figure 15:
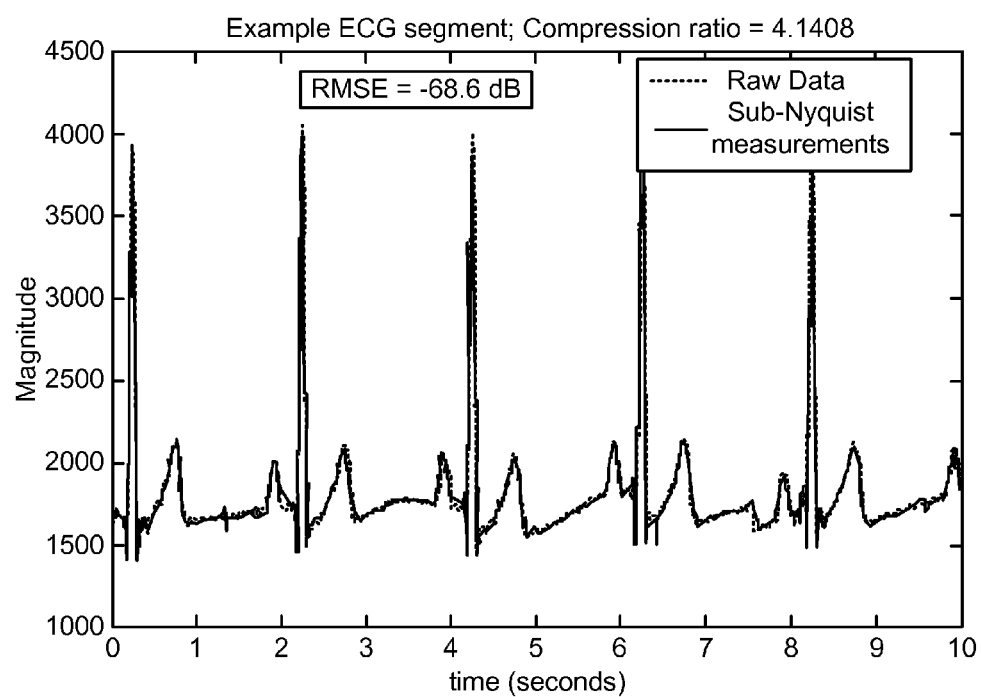
FIG. 15 illustrates an example of ECG data reconstructed at an aggregator.
Figure 17:
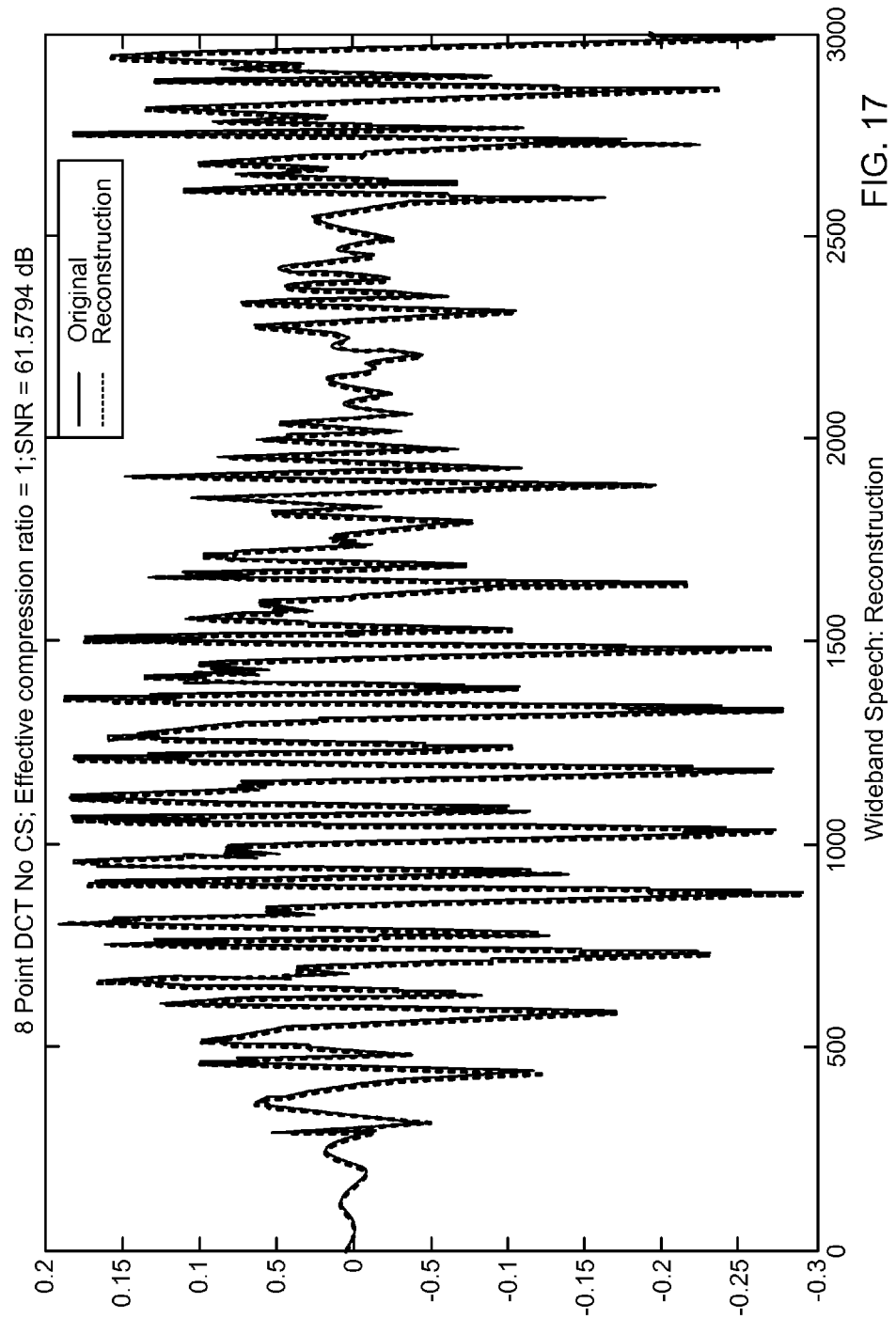
FIG. 17 illustrates an example of speech data reconstructed at an aggregator.
Figure 18:
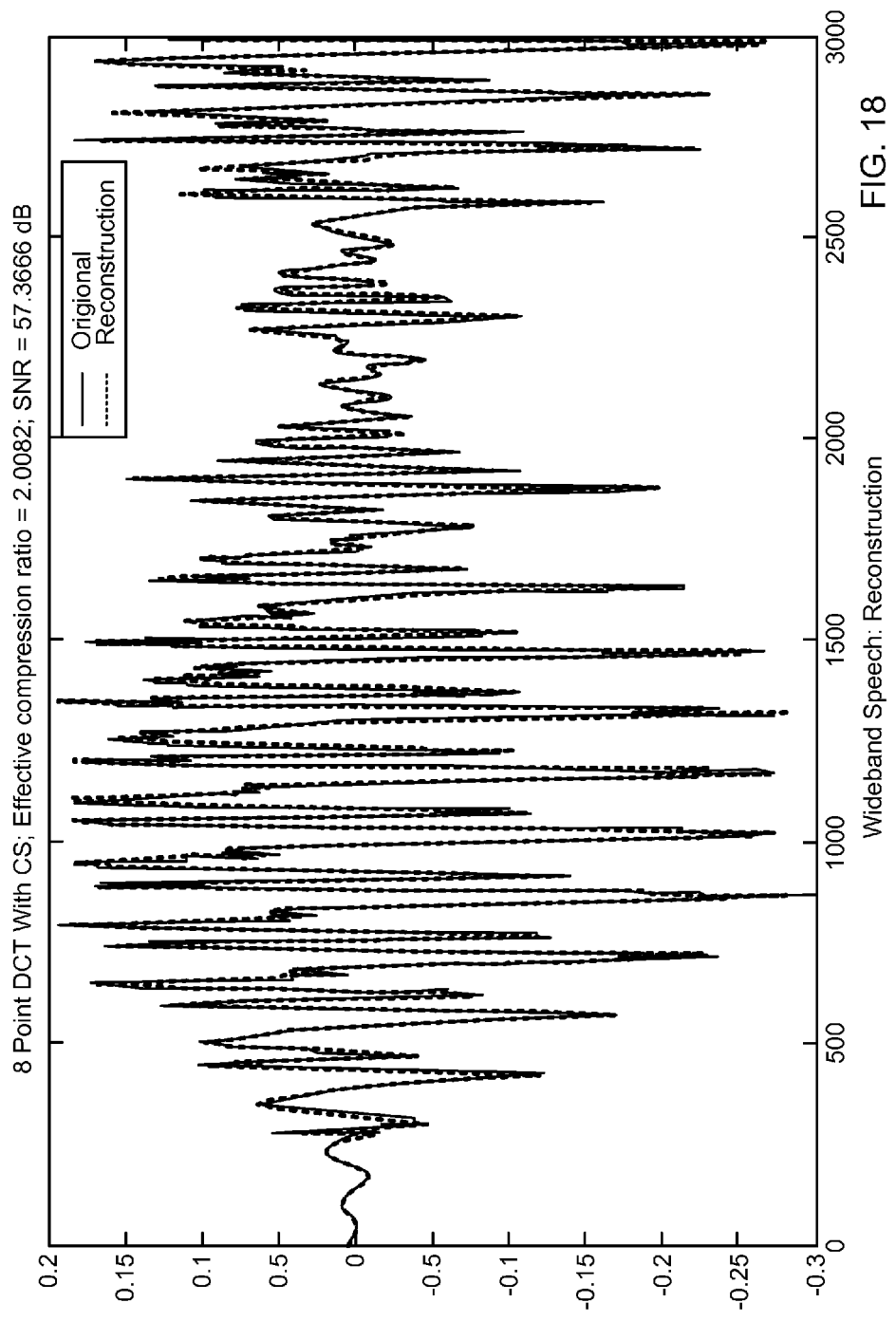
FIG. 18 illustrates an example of speech data reconstructed at an aggregator.

Compression Ratio may be defined as Nyquist_rate/Compressed_data_rate. FIGS. 15-1 show examples of ECG data, FIGS. 17-18 show examples of speech data, and FIGS. 20-24 show examples of 3D-accelerometer data with various compression ratios.

Distortion or compression quality may be difficult to assess in the context of lossy compression schemes. The quality depends to a large extent on the application. For speech and audio applications, it is customary to enlist novice and expert listeners to evaluate the quality of data after a lossy compression scheme, as objective metrics such as mean squared error (MSE) do not correlate well with perception quality. In the context of BANs, normalized root mean squared error (RMSE) between the original and the reconstructed signal may be used. The expression for the normalized RMSE (in dB) is given by $$20 \cdot \log_{10}\left(\frac{\|\hat{x} - x\|_{L_2}}{\|x\|_{L_2}}\right),$$

where $x$ is the raw signal and $\hat{x}$ is the decoded version obtained from the compressed data (which may be sub-Nyquist measurements and locations). The normalization is with respect to the input signal dynamic range. It is also possible to consider application specific tasks such as classification error for different activity states, error in the heart rate estimation, etc.

Figure 14:
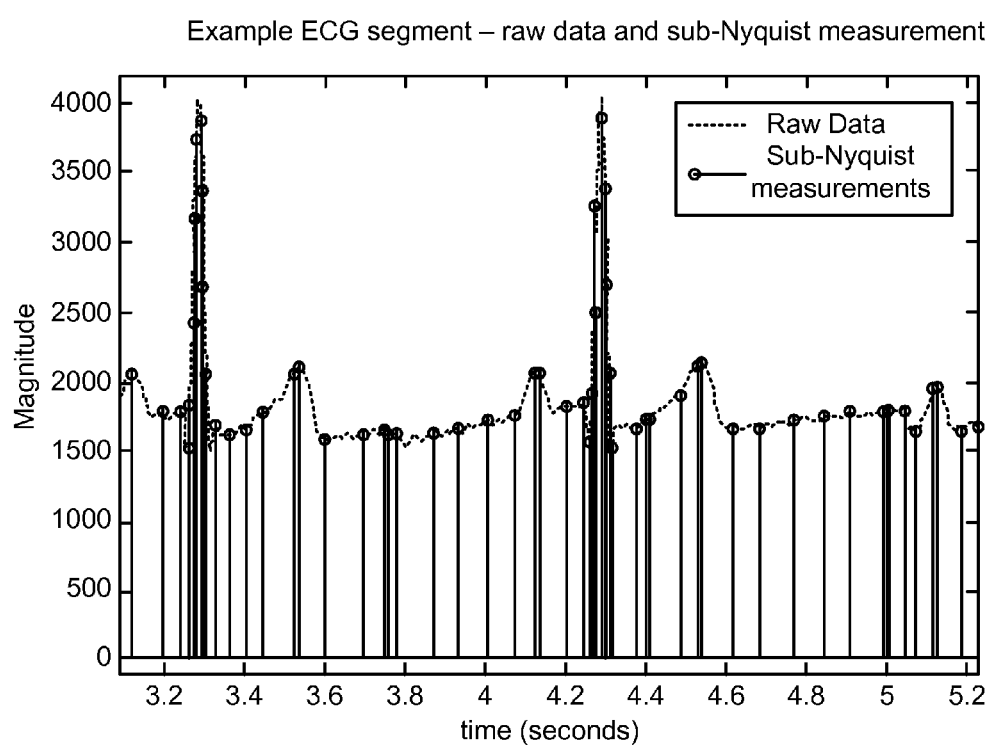
FIG. 14 illustrates an example of ECG data measurements at a sensor.

FIG. 14 shows an example ECG segment with selected samples based on the methods 1000a-1000d described above. In the illustrated simulations discussed herein, the samples are sub-Nyquist samples, but those of skill in the art will understand that many other realizations of signals and samples are possible. In essence the compressed representation for the ECG segment in FIG. 14 is given by the selected sub-Nyquist measurements and their locations. All the ECG examples generated in these simulations used raw data acquired at a sampling rate of 200 Hz.

FIG. 15 shows an example ECG segment (10 second duration) that was compressed using the local extrema based sensing approach described herein, and also shows the corresponding decoded version. The reconstruction normalized RMSE in this case is −68.6 dB and the compression ratio is equal to 4.14. Note that the morphology and the dynamic range of the decoded ECG signal are in good agreement with the raw version.

Figure 16:
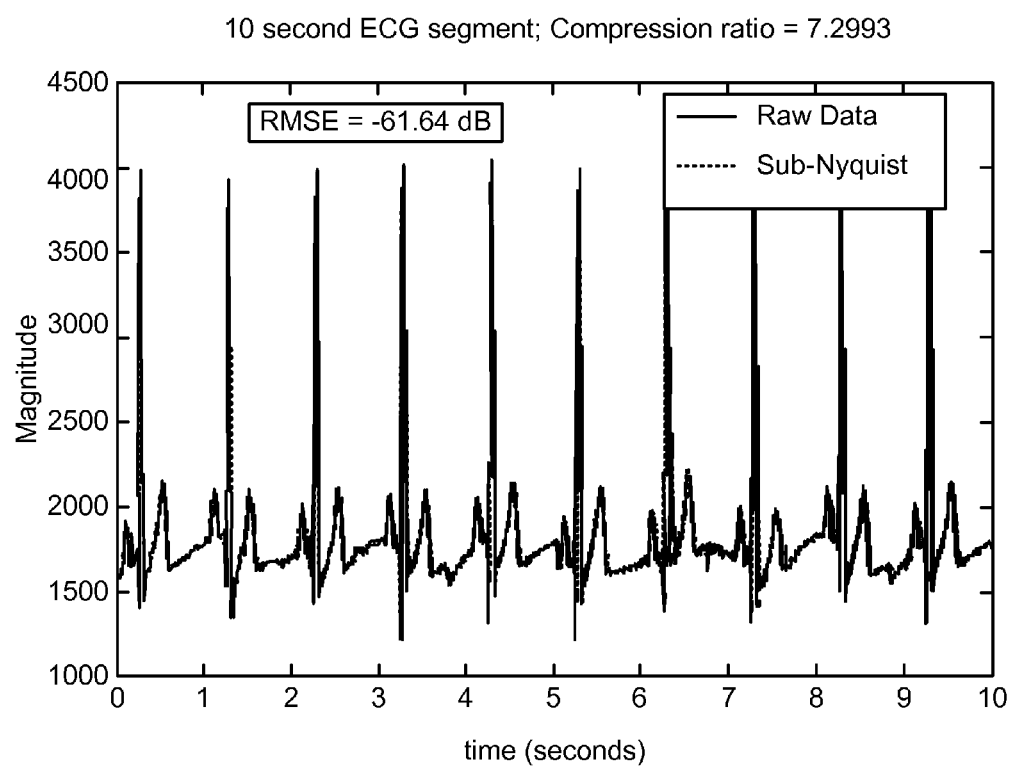
FIG. 16 illustrates an example of ECG data reconstructed at an aggregator.

FIG. 16 shows another example ECG segment (10 second duration) that was compressed using the extrema-based sensing approach described here, and also shows the corresponding decoded version. The reconstruction normalized RMSE in this case is −61.6 dB and the compression ratio is equal to 7.29. This segment shows a higher heart rate than FIG. 15.

The methods described herein may be used for data with wider bandwidth than the signals discussed above, for example for use with speech signals. In known algorithms, there are primarily two methods of applying a sensing paradigm to speech and audio. (1) Directly apply point sampling in the time domain. (2) Apply point sampling in a spectral domain. The second method has better potential for compression because the spectral properties of speech and audio may be exploited. For example, different constraints on the sensing in each spectral band may be enforced and correlated to the relative acoustic importance of those bands. However, such methods are generally dependent on the properties of speech. Similarly, compression schemes such as music compression are generally dependent on the properties of hearing. Those of skill in the art will appreciate that the methods described herein may be implemented independent of outside physical constraints such as speech and hearing properties.

FIG. 17 shows an example of a 16 kHz sampled wideband speech signal which has been taken through a DCT transform followed by its inverse DCT to retrieve the signal. FIG. 18 shows the same signal but with a ~2× compression that is achieved by applying different sensing constraints in different spectral bands. Reconstruction is applied to the local extrema based sensed data in the spectral domain. It can be seen that only about 4 dB of SNR is lost at the benefit of 2× compression over the baseline, no compression case.

Figure 19:
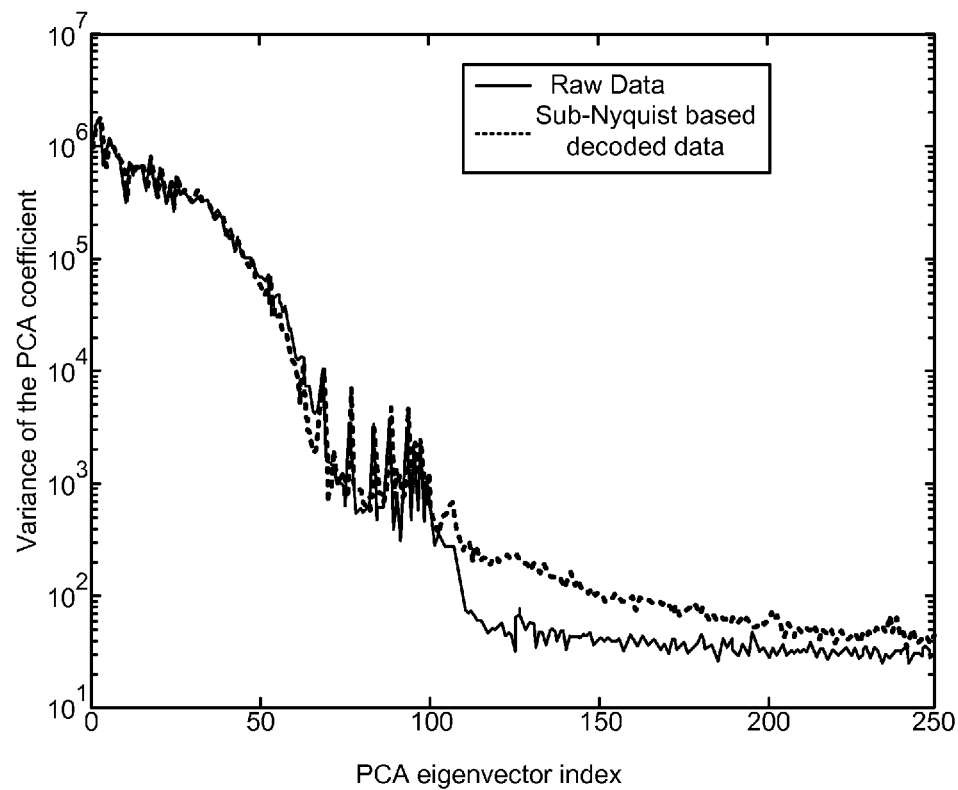
FIG. 19 illustrates an example of resulting variances in the PCA coefficients obtained from the reconstructed ECG segments at an aggregator.
Figure 20:
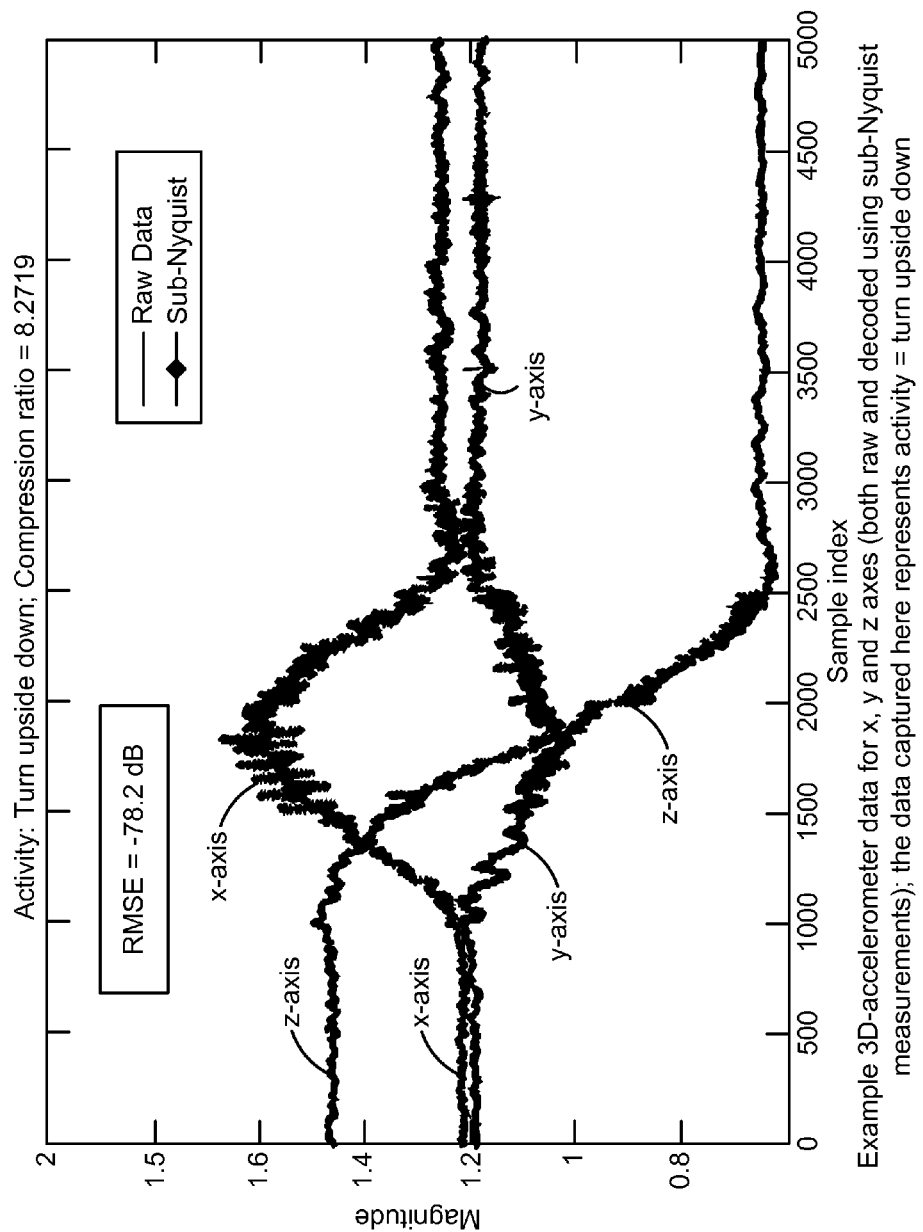
FIG. 20 illustrates an example of three-dimensional accelerometer data reconstructed at an aggregator.
Figure 21:
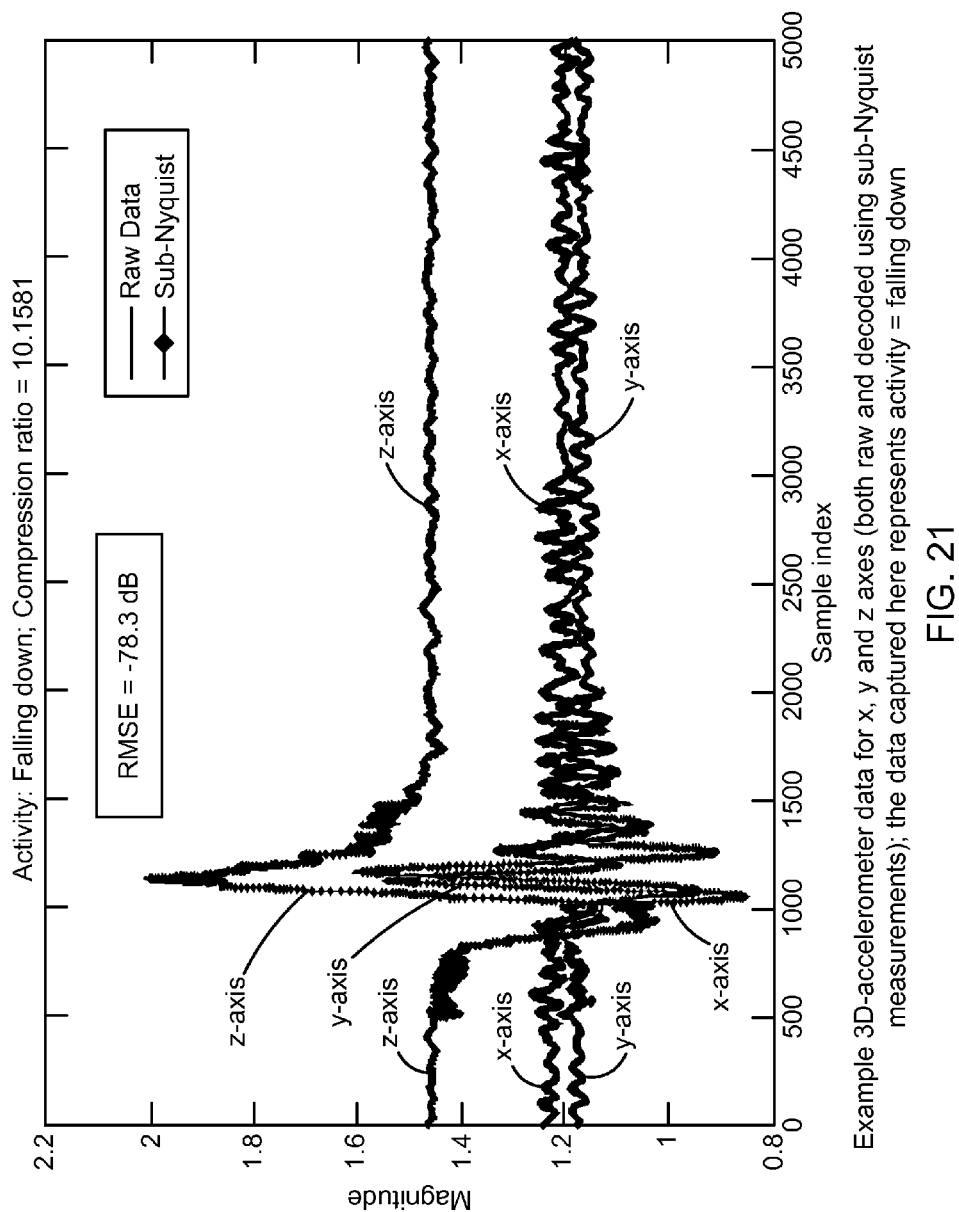
FIG. 21 illustrates an example of three-dimensional accelerometer data reconstructed at an aggregator.
Figure 22:
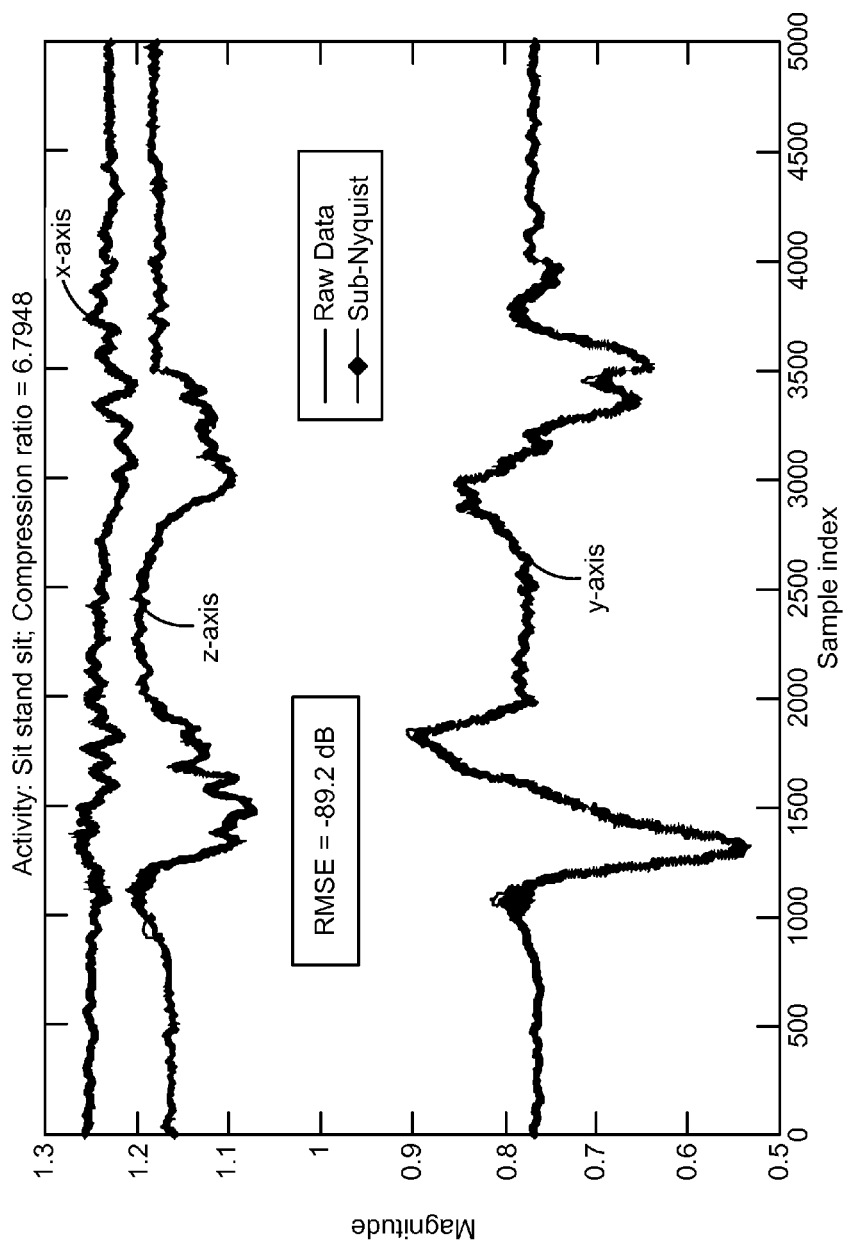
FIG. 22 illustrates an example of three-dimensional accelerometer data reconstructed at an aggregator.
Figure 23:
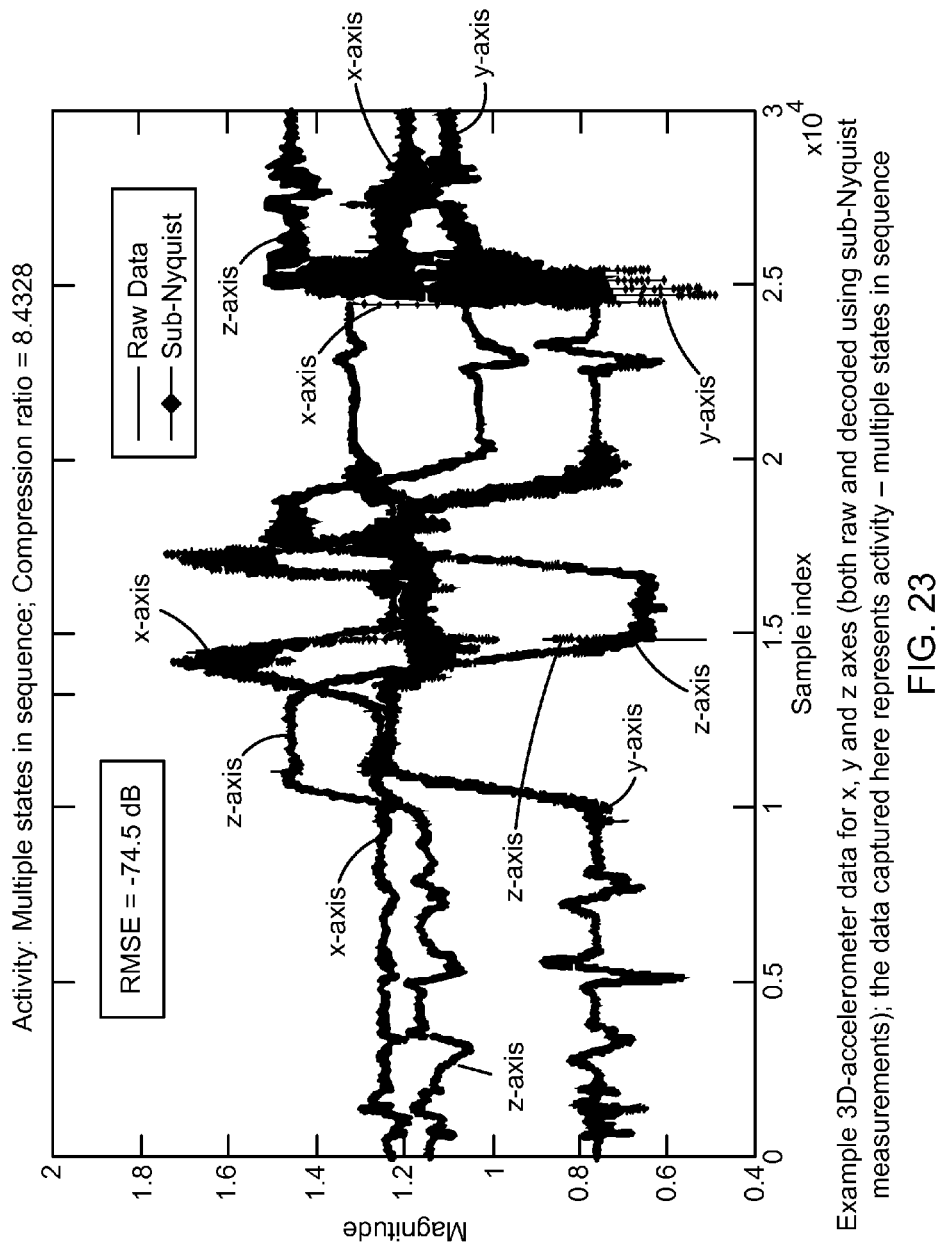
FIG. 23 illustrates an example of three-dimensional acceleration data reconstructed at an aggregator.

An alternate way to analyze the reconstruction quality based on the compressed measurements will now be presented. A principal component analysis based projection basis may be constructed, which is obtained using eigenvector decomposition of the covariance matrix computed from the raw ECG data (sampled at 200 Hz, each segment of length 250 samples, total number of segments used to compute the covariance matrix close to 50000). In this case, 250 eigenvectors are obtained, each being a vector of dimension 250. The projection of the ECG segment on to PCA basis quantifies the signal variance along each eigenvector dimension. For the simulation shown in FIG. 19, a 5 minute long ECG segment is considered, and compressed and decoded by processing segments of 250 samples. FIG. 19 analyzes the reconstruction quality of the decoder by plotting the variances of the projected PCA coefficients along the 250 PCA eigenvectors. Both raw ECG segments and sub-Nyquist based decoded ECG segments were projected on a PCA basis (trained using a covariance matrix obtained from similar ECG data). Variances plotted in the graph were averaged over 230 segments, each of length 250 samples. It may be observed that the variances for the coefficients in the PCA domain indicate good agreement between the decoded signal and raw data.

FIGS. 20-23 show examples, based on 3D-accelerometer data, for the local extrema based sensing and compression approach. The different figures demonstrate the decoded and raw versions of accelerometer data, for different activity conditions. All the 3D-accelerometer data included herein was obtained by placing the sensor on a human chest. It is demonstrated that RMSE<−74 dB and compression ratio>6 for various examples considered here.

Next, an example where x is decomposed into M sub-bands using Empirical Mode Decomposition (EMD) is presented. In each sub-band m, the parameters $T_{m1}$, $T_{m2}$, maxTread$_m$, $p_m$, and $q_m$ are used to generate $K_m$ sets of measurements. The $K_m$ measurements are packetized and transmitted. The decoding process is applied to each of these sub-bands and these estimated sub-band signals are added back to give the signal estimate $\hat{x}$. Recall that the compression ratio is defined as Nyquist_rate/Compressed_data_rate. In this case the compressed data rate is computed by adding the bits needed to represent the extrema points and locations, or values and treads at those points, for each sub-band.

Figure 24:
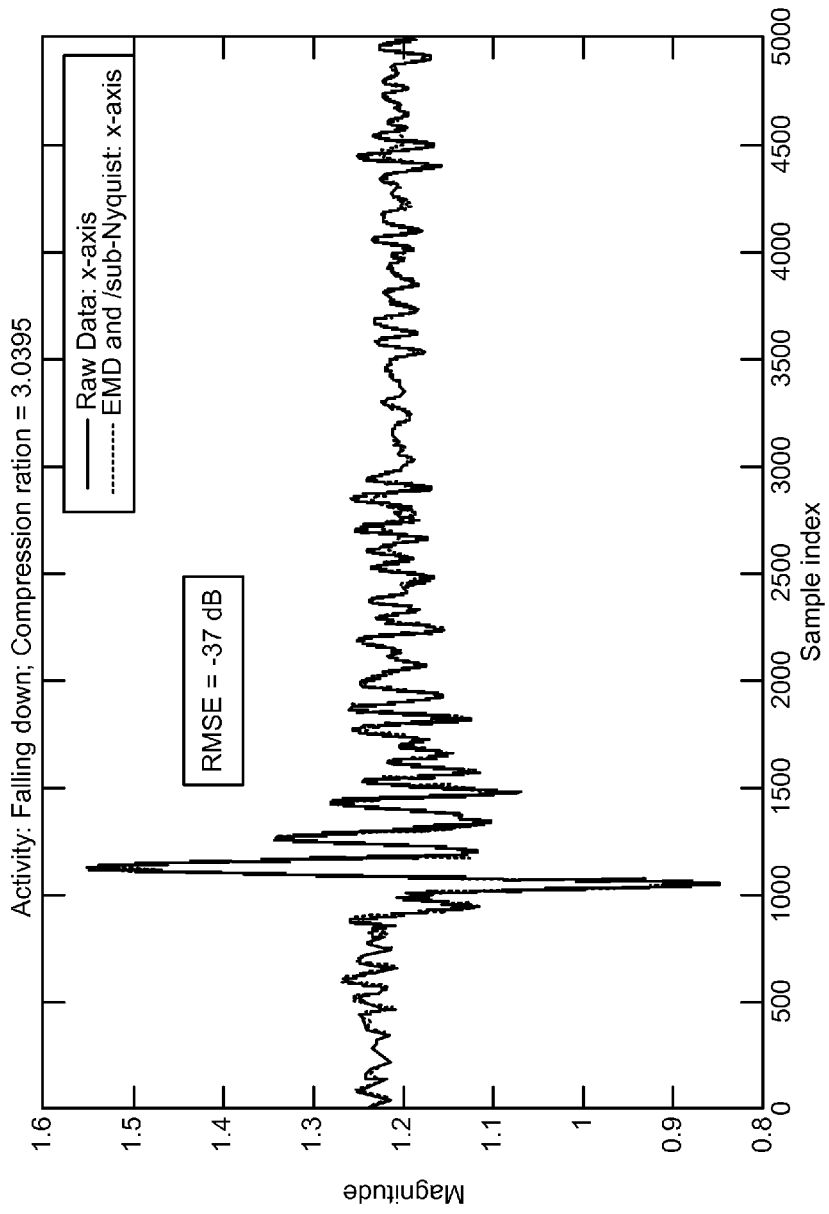
FIG. 24 illustrates an example of three-dimensional accelerometer data reconstructed at an aggregator.

FIG. 24 shows an example, based on accelerometer data, to demonstrate the local extrema based compression within each sub-band.

Algorithm latency may be critical in certain real-time services. The latency of methods described herein can be approximately the duration of a single transmission packet during reconstruction.

Those of skill in the art will appreciate many advantages of the systems, devices, and methods described herein. For example, low power encoding may be achieved, which may reduce over the air bandwidth in BAN applications without complex encoding algorithms. In addition, the methods are generic for multiple classes of signals. In the simulations presented above, it was demonstrated that compression is appropriate for ECG, 3D-accelerometer, and speech data. Systems, devices, and methods of some aspects are described herein with respect to extrema. Those of skill in the art will appreciate that the systems, devices, and methods may also pertain to a single extremum, as well as a plurality of extrema.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, a signal, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Thus, in some aspects computer readable medium may comprise non-transitory computer readable medium (e.g., tangible media). In addition, in some aspects computer readable medium may comprise transitory computer readable medium (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material. In some aspects, the computer program product comprises a hardware component such as a field-programmable array (FPGA) or ASIC having executable instructions stored thereon. In some aspects, the computer program product comprises a DSP or processor having such stored instructions.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by an access terminal and/or access point as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that an access terminal and/or access point can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods, apparatuses, and systems described above without departing from the scope of the claims.

A wireless device in the present disclosure may include various components that perform functions based on signals that are transmitted by or received at the wireless device. A wireless device may also refer to a wearable wireless device. In some aspects the wearable wireless device may comprise a wireless headset or a wireless watch. For example, a wireless headset may include a transducer adapted to provide audio output based on data received via a receiver. A wireless watch may include a user interface adapted to provide an indication based on data received via a receiver. A wireless sensing device may include a sensor adapted to provide data to be transmitted via a transmitter.

Although wireless devices are described above with respect to a biometric data and/or a BAN, wireless devices in the present disclosure are not limiting to these configurations or implementations. For example, a wireless device according to the teachings herein may be used in a medical, fitness, well-being, gaming, or automotive environment, among other environments and uses. As described further below, wireless devices in such environments are not limited to BANs, but may communicate in any wireless environment, for example in a local area network (LAN), wide area network (WAN), personal area network, cellular network, controller area network (CAN), or other such network or environment.

A wireless device may communicate via one or more wireless communication links that are based on or otherwise support any suitable wireless communication technology. For example, in some aspects a wireless device may associate with a network. In some aspects the network may comprise a personal area network (e.g., supporting a wireless coverage area on the order of 30 meters) or a body area network (e.g., supporting a wireless coverage area on the order of 10 meters) implemented using ultra-wideband technology or some other suitable technology. In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components (e.g., transmitter 210 and receiver 212) that may include various components (e.g., signal generators and signal processors) that facilitate communication over a wireless medium.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA") or so-called smartphone, an entertainment device (e.g., a portable media device, including music and video players), a headset (e.g., headphones, an earpiece, etc.), a microphone, a medical sensing device (e.g., a biometric sensor, a heart rate monitor, a pedometer, an EKG device, a smart bandage, etc.), a patient monitoring device (e.g., an MPS), a user I/O device (e.g., a watch, a remote control, a light switch, a keyboard, a mouse, etc.), an environment sensing device (e.g., a tire pressure monitor), a monitoring device that may receive data from the medical or environment sensing device (e.g., a desktop, a mobile computer, etc.), a point-of-care device, a hearing aid, a set-top box, or any other suitable device. The monitoring device may also have access to data from different sensing devices via connection with a network.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses).

In some aspects a wireless device may comprise an access device (e.g., an access point) for a communication system. Such an access device may provide, for example, connectivity to another network (e.g., a wide area network such as the Internet or a cellular network) via a wired or wireless communication link. Accordingly, the access device may enable another device (e.g., a wireless station) to access the other network or some other functionality. In addition, it should be appreciated that one or both of the devices may be portable or, in some cases, relatively non-portable. Also, it should be appreciated that a wireless device also may be capable of transmitting and/or receiving information in a non-wireless manner (e.g., via a wired connection) via an appropriate communication interface.

The invention claimed is:

1. A method for processing data, comprising:
    determining a plurality of points in a signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;
    quantizing the plurality of points;
    determining measurements associated with the plurality of points, each measurement comprising quantized signal and tread values; and
    generating a compressed version of the signal by discarding one or more measurements of the plurality of points that do not satisfy a predetermined condition;
    wherein the method is performed by one or more processors.

2. The method of claim 1, wherein the first point is a local maximum of the signal.

3. The method of claim 1, wherein the signal comprises an analog signal.

4. The method of claim 1, wherein the signal comprises a discrete signal.

5. The method of claim 1, wherein the determining the measurements associated with the plurality of points comprises determining a measurement at two or more of the plurality of points, and further comprising selectively discarding one or more of the measurements based on a comparison of quantized signal and tread values of the one or more of the measurements with quantized signal and tread values of another one of the measurements.

6. The method of claim 5, wherein a measurement is discarded if the measurement is both separated from a nearest adjacent measurement by a distance that is substantially equivalent to a distance between the nearest adjacent measurement and another measurement adjacent the nearest adjacent measurement, and has a value that when comparing to a value of the nearest adjacent measurement yields a difference being within a second threshold.

7. The method of claim 1, wherein the determining measurements associated with the plurality of points comprises quantizing tread values of the signal at a plurality of points in the signal such that each measurement is separated from a nearest measurement by a distance that is less than a maximum separation.

8. The method of claim 7, wherein at least one of the tread values between two points is represented by p bits, and wherein the maximum separation is less than or equal to $2^p$.

9. The method of claim 1, wherein the quantized signal value is represented by q bits, and wherein the quantizing is performed by a q-bit quantizer.

10. The method of claim 9, wherein the q-bit quantizer comprises a q-bit non-uniform quantizer.

11. The method of claim 1, further comprising determining a plurality of points for a plurality of sub-bands, at least one point of the plurality of points of each sub-band comprising a local maximum or a local minimum of the respective sub-band or a point having a value that when comparing to a value of another point yields a difference being greater than a respective threshold of the sub-band, and determining a measurement of at least one point in each of the sub-bands.

12. The method of claim 11, wherein the respective threshold of at least one sub-band is different from the respective threshold of at least one other sub-band.

13. The method of claim 11, wherein the respective thresholds for two or more of the sub-bands are substantially equivalent.

14. The method of claim 11, further comprising quantizing a tread and a value at a plurality of points for each sub-band such that each measurement of the respective sub-band is separated from a nearest measurement of the respective sub-band by a distance that is less than a respective maximum separation for the sub-band, wherein the respective maximum separation of at least one sub-band is different from the respective maximum separation of at least one other sub-band.

15. The method of claim 14, wherein the tread between two points of each sub-band is represented by a respective quantity of bits for that sub-band, wherein the respective maximum separation for each sub-band is less than or equal to 2 raised to the power of the respective quantity, and wherein the respective quantity for at least one sub-band is different from the respective quantity for at least one other sub-band.

16. The method of claim 11, wherein the measurement for each sub-band comprises a quantized signal value at the at least one point in the respective sub-band, wherein each quantized signal value is represented by a respective quantity of bits for that respective sub-band, and wherein the respective quantity for at least one sub-band is different from the respective quantity for at least one other sub-band.

17. The method of claim 1, wherein the quantizing is performed by a uniform quantizer.

18. The method of claim 1, further comprising transmitting the quantized signal and tread values.

19. The method of claim 1, further comprising storing the quantized signal and tread values.

20. The method of claim 1, further comprising generating the signal with a biomedical sensor.

21. The method of claim 1, further comprising generating the signal with an accelerometer.

22. The method of claim 1, wherein the first point is a local minimum of the signal.

23. The method of claim 1, wherein the plurality of points are uniformly spaced.

24. The method of claim 1, wherein the determining the plurality of points in the signal further comprises:
selecting the first predetermined threshold;
determining the absolute rise at the second point;
comparing the absolute rise at the second point to the first predetermined threshold; and
identifying that the absolute rise at the second point is greater than the first predetermined threshold.

25. An apparatus for processing data, comprising:
a processing system configured to:
determine a plurality of points in a signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;
quantize the plurality of points;
determine measurements associated with the plurality of points, each measurement comprising quantized signal and tread values; and
generate a compressed version of the signal by discarding one or more measurements of the plurality of points that do not satisfy a predetermined condition.

26. The apparatus of claim 25, wherein the first point is a local maximum of the signal.

27. The apparatus of claim 25, wherein the signal comprises an analog signal.

28. The apparatus of claim 25, wherein the signal comprises a discrete signal.

29. The apparatus of claim 25, wherein the processing system is further configured to determine a measurement at two or more of the plurality of points, and selectively discard the one or more of the measurements based on a comparison of quantized signal and tread values of the one or more of the measurements with quantized signal and tread values of another one of the measurements.

30. The apparatus of claim 29, wherein a measurement is discarded if the measurement is both separated from a nearest adjacent measurement by a distance that is substantially equivalent to a distance between the nearest adjacent measurement and another measurement adjacent the nearest adjacent measurement, and has a value that when comparing to a value of the nearest adjacent measurement yields a difference being within a second threshold.

31. The apparatus of claim 25, wherein the processing system is further configured to quantize tread values of the signal at a plurality of points in the signal such that each measurement is separated from a nearest measurement by a distance that is less than a maximum separation.

32. The apparatus of claim 31, wherein at least one of the tread values is represented by p bits, and wherein the maximum separation is less than or equal to $2^p$.

33. The apparatus of claim 25, wherein the quantized signal value is represented by q bits, and wherein the processing system comprises a q-bit quantizer.

34. The apparatus of claim 33, wherein the q-bit quantizer comprises a q-bit non-uniform quantizer.

35. The apparatus of claim 25, wherein the processing system is configured determine a plurality of points for a plurality of sub-bands, at least one point of the plurality of points of each sub-band comprising a local maximum or a local minimum of the respective sub-band or a point having a value that when comparing to a value of another point yields a difference being greater than a respective threshold of the sub-band, and to determine a measurement of at least one point in each of the sub-bands.

36. The apparatus of claim 35, wherein the respective threshold of at least one sub-band is different from the respective threshold of at least one other sub-band.

37. The apparatus of claim 35, wherein the respective thresholds for two or more of the sub-bands are substantially equivalent.

38. The apparatus of claim 35, wherein the processing system is further configured to quantize a tread and a value at a plurality of points for each sub-band such that each measurement of the respective sub-band is separated from a nearest measurement of the respective sub-band by a distance that is less than a respective maximum separation for the sub-band, and wherein the respective maximum separation of at least one sub-band is different from the respective maximum separation of at least one other sub-band.

39. The apparatus of claim 38, wherein the tread between two points of each sub-band is represented by a respective quantity of bits for that sub-band, wherein the respective maximum separation for each sub-band is less than or equal to 2 raised to the power of the respective quantity, and wherein the respective quantity for at least one sub-band is different from the respective quantity for at least one other sub-band.

40. The apparatus of claim 35, wherein the measurement for each sub-band comprises a quantized signal value at the at least one point in the respective sub-band, wherein each quantized signal value is represented by a respective quantity of bits for that respective sub-band, and wherein the respective quantity for at least one sub-band is different from the respective quantity for at least one other sub-band.

41. The apparatus of claim 25, wherein the processing system further comprises a uniform quantizer.

42. The apparatus of claim 25, further comprising a transmitter configured to transmit the quantized signal and tread values.

43. The apparatus of claim 25, further comprising a memory configured to store the quantized signal and tread values.

44. The apparatus of claim 25, further comprising a biomedical sensor configured to generate the signal.

45. The apparatus of claim 25, further comprising an accelerometer configured to generate the signal.

46. The apparatus of claim 25, wherein the first point is a local minimum of the signal.

47. The apparatus of claim 25, wherein the plurality of points are uniformly spaced.

48. The apparatus of claim 25, wherein the processing system is further configured to select the first predetermined threshold, determine the absolute rise at the second point, compare the absolute rise at the second point to the first predetermined threshold, and identify that the absolute rise at the second point is greater than the first predetermined threshold.

49. An apparatus for processing data, comprising:
means for determining a plurality of points in a signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;
means for quantizing the plurality of points;
means for determining measurements associated with the plurality of points, each measurement comprising quantized signal and tread values; and
means for generating a compressed version of the signal by discarding one or more measurements of the plurality of points that do not satisfy a predetermined condition.

50. The apparatus of claim 49, wherein the first point is a local maximum of the signal.

51. The apparatus of claim 49, wherein the signal comprises an analog signal.

52. The apparatus of claim 49, wherein the signal comprises a discrete signal.

53. The apparatus of claim 49, wherein the means for determining the measurements associated with the plurality of points comprises means for determining a measurement at two or more of the plurality of points, and wherein the apparatus further comprises means for selectively discarding one or more of the measurements based on a comparison of quantized signal and tread values of the one or more of the measurements with quantized signal and tread values of another one of the measurements.

54. The apparatus of claim 53, wherein a measurement is discarded if the measurement is both separated from a nearest adjacent measurement by a distance that is substantially equivalent to a distance between the nearest adjacent measurement and another measurement adjacent the nearest adjacent measurement, and has a value that when comparing to a value of the nearest adjacent measurement yields a difference being within a second threshold.

55. The apparatus of claim 49, wherein the means for determining the measurements comprises means for quantizing tread values of the signal at a plurality of points in the signal such that each measurement is separated from a nearest measurement by a distance that is less than a maximum separation.

56. The apparatus of claim 55, wherein at least one of the tread values between two points is represented by p bits, and wherein the maximum separation is less than or equal to $2^p$.

57. The apparatus of claim 49, wherein the quantized signal value is represented by q bits, and wherein the means for quantizing is a q-bit quantizer.

58. The apparatus of claim 57, wherein the q-bit quantizer comprises a q-bit non-uniform quantizer.

59. The apparatus of claim 49, comprising means for determining a plurality of points for a plurality of sub-bands, at least one point of the plurality of points of each sub-band comprising a local maximum or a local minimum of the respective sub-band or a point having a value that when comparing to a value of another point yields a difference being greater than a respective threshold of the sub-band, and means for determining a measurement of at least one point in each of the sub-bands.

60. The apparatus of claim 59, wherein the respective threshold of at least one sub-band is different from the respective threshold of at least one other sub-band.

61. The apparatus of claim 59, wherein the respective thresholds for two or more of the sub-bands are substantially equivalent.

62. The apparatus of claim 59, further comprising means for quantizing a tread and a value at a plurality of points for each sub-band such that each measurement of the respective sub-band is separated from a nearest measurement of the respective sub-band by a distance that is less than a respective maximum separation for the sub-band, wherein the respective maximum separation of at least one sub-band is different from the respective maximum separation of at least one other sub-band.

63. The apparatus of claim 62, wherein the tread between two points of each sub-band is represented by a respective quantity of bits for that sub-band, wherein the respective maximum separation for each sub-band is less than or equal to 2 raised to the power of the respective quantity, and wherein the respective quantity for at least one sub-band is different from the respective quantity for at least one other sub-band.

64. The apparatus of claim 59, wherein the measurement for each sub-band comprises a quantized signal value at the at least one point in the respective sub-band, wherein each quantized signal value is represented by a respective quantity of bits for that respective sub-band, and wherein the respective quantity for at least one sub-band is different from the respective quantity for at least one other sub-band.

65. The apparatus of claim 49, wherein the means for quantizing comprises a uniform quantizer.

66. The apparatus of claim 49, further comprising means for transmitting the quantized signal and tread values.

67. The apparatus of claim 49, further comprising means for storing the quantized signal and tread values.

68. The apparatus of claim 49, further comprising a biomedical sensor configured to generate the signal.

69. The apparatus of claim 49, further comprising an accelerometer configured to generate the signal.

70. The apparatus of claim 49, wherein the first point is a local minimum of the signal.

71. The apparatus of claim 49, wherein the plurality of points are uniformly spaced.

72. A computer program product for processing data comprising a non-transitory computer readable medium comprising instructions that when executed cause an apparatus to:

determine a plurality of points in a signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;

quantize the plurality of points;

determine measurements associated with the plurality of points, each measurement comprising quantized signal and tread values; and generate a compressed version of the signal by discarding one or more measurements of the plurality of points that do not satisfy a predetermined condition.

73. The computer program product of claim 72, wherein the plurality of points are uniformly spaced.

74. A sensing device, comprising:

a processing system configured to:

determine a plurality of points in a signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;

quantize the plurality of points;

determine measurements associated with the plurality of points, each measurement comprising quantized signal and tread values; and generate a compressed version of the signal by discarding one or more measurements of the plurality of points that do not satisfy a predetermined condition; and a transmitter configured to transmit the compressed version of the signal.

75. The sensing device of claim 74, wherein the plurality of points are uniformly spaced.

76. A headset, comprising:

a transducer configured to provide a signal; and a processing system configured to:

determine a plurality of points in the signal, wherein the plurality of points comprises at least a first point comprising a local maximum or a local minimum of the signal, and at least a second point in the signal comprising a value which, when compared to a value of an adjacent point in the signal, yields an absolute rise at the second point being greater than a first predetermined threshold, and wherein the second point is not a local maximum or a local minimum of the signal;

quantize the plurality of points;

determine measurements associated with the plurality of points, each measurement comprising quantized signal and tread values; and generate a compressed version of the signal by discarding one or more measurements of the plurality of points that do not satisfy a predetermined condition.

77. The headset of claim 76, wherein the plurality of points are uniformly spaced.

* * * * *